United States Patent [19]
Tsukamoto et al.

[11] Patent Number: 5,581,646
[45] Date of Patent: Dec. 3, 1996

[54] METHOD OF COUPLING OPTICAL PARTS AND REFRACTIVE INDEX IMAGING MATERIAL

[75] Inventors: Koji Tsukamoto; Takeshi Ishitsuka; Tetsuzo Yoshimura; Katsusada Motoyoshi; Yasuhiro Yoneda, all of Kawasaki, Japan

[73] Assignee: Fujitsu Limited, Kawasaki, Japan

[21] Appl. No.: 507,933

[22] Filed: Jul. 27, 1995

Related U.S. Application Data

[63] Continuation of Ser. No. 148,630, Nov. 8, 1993, abandoned.

[30] Foreign Application Priority Data

Nov. 9, 1992 [JP] Japan .................................. 4-298920
Sep. 8, 1993 [JP] Japan .................................. 5-223723

[51] Int. Cl.⁶ .................................................. G02B 6/255
[52] U.S. Cl. ........................ 385/96; 385/97; 385/140; 522/172
[58] Field of Search ........................ 385/95, 96, 97, 385/98, 99, 140; 522/172

[56] References Cited

U.S. PATENT DOCUMENTS

| | | | |
|---|---|---|---|
| 4,487,475 | 12/1984 | Ogawa | 385/96 |
| 4,557,556 | 12/1985 | Decker, Jr. | 385/140 |
| 4,695,306 | 9/1987 | Hakoun et al. | 65/152 |
| 4,784,458 | 11/1988 | Horowitz et al. | 385/97 |
| 4,789,620 | 12/1988 | Sasaki et al. | 430/280 |
| 4,825,092 | 4/1989 | Mehadji | 250/561 |
| 4,854,667 | 8/1989 | Ebata et al. | 385/96 X |
| 4,971,418 | 11/1990 | Dorsey et al. | 385/96 |
| 5,285,516 | 2/1994 | Wong | 385/96 |

FOREIGN PATENT DOCUMENTS

| | | |
|---|---|---|
| 0125710 | 11/1984 | European Pat. Off. . |
| 0129443 | 12/1984 | European Pat. Off. . |
| 0320947 | 12/1988 | European Pat. Off. . |
| 0324481 | 7/1989 | European Pat. Off. . |
| 0324480 | 7/1989 | European Pat. Off. . |
| 0323563 | 7/1989 | European Pat. Off. . |
| 0420027 | 9/1990 | European Pat. Off. . |
| 0491366 | 12/1991 | European Pat. Off. . |
| 53-108452 | 9/1978 | Japan . |
| 55-43538 | 3/1980 | Japan . |
| 55-043538 | 3/1980 | Japan . |
| 60-173508 | 9/1985 | Japan . |
| 64-6909 | 1/1989 | Japan . |
| 3-36582 | 2/1991 | Japan . |
| 5155944 | 6/1993 | Japan . |
| 4325508 | 11/1993 | Japan . |
| 1408586 | 11/1972 | United Kingdom . |
| 1482996 | 11/1974 | United Kingdom . |
| 2067210 | 7/1981 | United Kingdom . |
| 2143650 | 7/1984 | United Kingdom . |
| 2185127 | 12/1986 | United Kingdom . |
| 2189048 | 4/1987 | United Kingdom . |
| WO91/03751 | 3/1991 | United Kingdom . |
| 2252842 | 1/1992 | United Kingdom . |

*Primary Examiner*—John D. Lee
*Assistant Examiner*—Phan T. H. Palmer
*Attorney, Agent, or Firm*—Armstrong, Westerman, Hattori, McLeland & Naughton

[57] ABSTRACT

A method of coupling optical parts including bonding the optical coupling faces of two optical waveguides by butting and fusing them. Also, a method for forming a refractive-index distribution having the focusing lens effect by setting the interval between the optical coupling faces of two optical parts to 0.1 mm or more, feeding a refractive-index imaging material also serving as an adhesive into the gap between the faces, and applying light to the refractive-index imaging material from the optical coupling face of at least one of the optical parts.

31 Claims, 20 Drawing Sheets

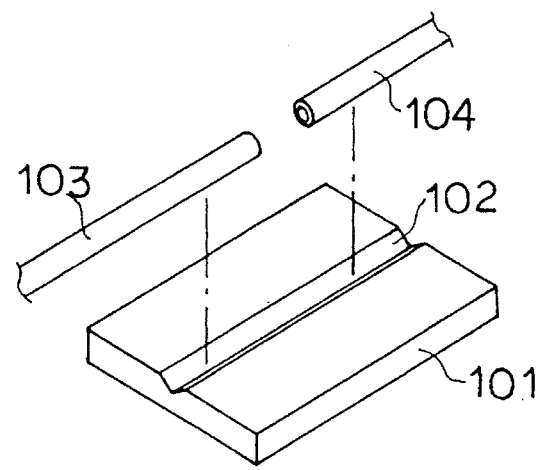
FIG. 15(a)
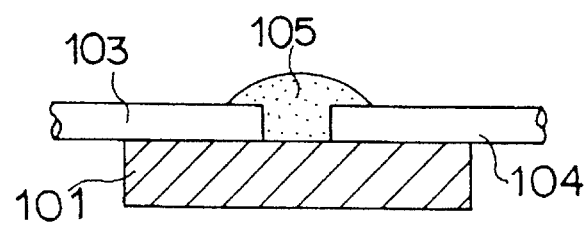
FIG. 15(b)
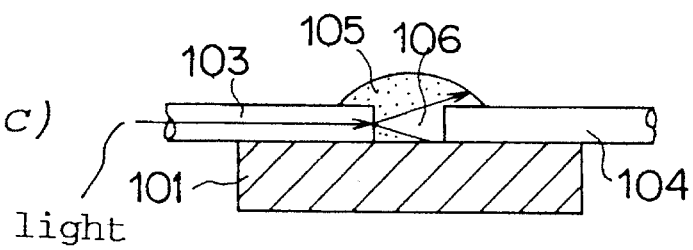
FIG. 15(c)
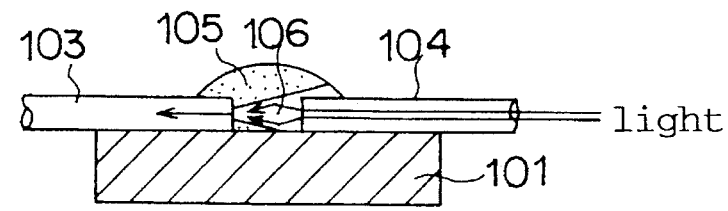
FIG. 15(d)
FIG. 16
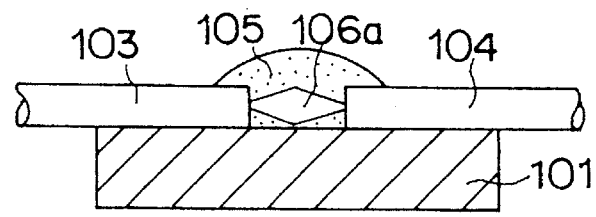

METHOD OF COUPLING OPTICAL PARTS AND REFRACTIVE INDEX IMAGING MATERIAL

This application is a continuation of application Ser. No. 08/148,630 filed Nov. 8, 1993, now abandoned.

BACKGROUND OF THE INVENTION

1. Field of the Invention

The present invention relates to a method of coupling optical parts and refractive-index imaging material, particularly to a method for coupling optical parts such as optical waveguides and optical devices in optical communication and optical interconnection and to a material used for coupling the optical parts.

2. Description of the Related Art

Optical parts are used for various optical information processing systems including optical interconnection and optical communication. For example, light emitted from a light source such as a semiconductor laser is transmitted through a waveguide or optical fiber and the transmitted light is changed into electric signals by a photodiode.

A high coupling efficiency is requires for optical coupling between optical parts. To obtain a high coupling efficiency, it is necessary to completely align optical electromagnetic fields between optical parts. Therefore, it is necessary to equalize the diameters of optical coupling faces at a joint between the optical parts and minimize optical axis misalignment and angular misalignment of the optical parts. To realize this, it is necessary to accurately align the coupling faces between optical parts. However, it is not easy to improve the alignment accuracy. Therefore, a method for easily and efficiently optically-coupling optical parts such as optical fibers and optical devices is desired.

FIGS. 1(a) to 1(c) show a general step for optical-coupling two optical fibers.

These optical fibers 1 and 2 have a structure in which cores 1a and 2a are enclosed by cladding 1b and 2b and the cores 1a and 2a have larger refractive index than the cladding 1b and 2b.

To optically couple the optical fibers 1 and 2, as shown in FIG. 1(a), the optical fiber 2 is secured to a fiber securing portion 3 and the optical fiber 1 is set to a mobile stage 4. Then, an operator moves the mobile stage 4 while observing it with a microscope 5 to accurately align the edge of the core 2a of the optical fiber 2 with that of the core 1a of the optical fiber 1 as shown in FIG. 1(b). After the alignment is completed, the joint between the optical fibers 1 and 2 is welded with an arc discharge apparatus 6.

However, the above method for optically coupling optical parts has a problem that optical coupling between optical parts cannot easily be performed because it is necessary to previously perform accurate alignment.

A measure for solving the above problem is desired for optical coupling between optical fibers or a coupler for optically coupling a light-emitting device or light-detecting device with an optical fiber or optical waveguide.

To accurately couple optical parts, Japanese Patent Laid-Open Nos. Sho. 53-108452 and Sho. 64-6909 disclose a method for melting the edges of two optical fibers and coupling them by the surface tension. However, these prior art references only disclose the coupling between optical fibers but do not disclose the coupling between other optical parts.

Moreover, accurate optical coupling between optical parts is considered by using couplers.

These couplers are described in the following documents.

[1] Optical Communication Device Optics—Light-Emitting and Light-Detecting Devices Hiroo Yonezu, Kogakutosho, Japan
[2] Optical Fiber Technology In ISDN Age, Katsuhiko Okubo, Rikogakusha, Japan
[3] Optical Communication Handbook, Edited by Hiroshi Hirayama et al., Kagakushinbunsha, Japan These documents show that an edge emitting laser has a rectangular structure with an active layer of approximately hundreds of nanometers by several microns and its radiation angle ranges between 20° and 60° in the vertical direction and between 5° and 20° in the horizontal direction. A surface emitting LED has a large emitting region diameter of 30 to 40 μm and a radiation angle of approximately 120°.

In this connection, a single-mode optical fiber has a core diameter of several to 10 microns and a multiple-mode optical fiber has a core diameter of several tens of microns. Therefore, to couple an optical semiconductor device with an optical fiber, accurate alignment along the order of 1-micron is desirable to decrease the coupling loss.

When accurately aligning and directly coupling a light-emitting device with an optical fiber by contacting the edge of the device with that of the fiber, more specifically, for direct coupling of an edge emitting laser with a single-mode optical fiber, the coupling efficiency approaches 30%. For direct coupling of the edge emitting laser with a multiple-mode optical fiber, the coupling efficiency approaches 50%. For direct coupling of a surface emitting LED with the multiple-mode optical fiber, the coupling efficiency approaches approximately 6%.

A method for setting a lens between an edge emitting laser and single-mode optical fiber has been proposed as a method for coupling the laser with the fiber. In this case, the coupling efficiency is approximately 50%. However, optical coupling becomes further difficult because the number of parts requiring accurate alignment increases.

For direct coupling of an optical fiber with a waveguide, a coupling efficiency of 56 to 79% is obtained by equalizing the core diameter of the waveguide edge diameter with that of the optical fiber and preventing misalignment of axes.

However, there is a problem that the direct coupling of the waveguide with the optical fiber is not easy because the core diameters of the waveguide and optical fiber are limited and accurate alignment at 1 μm order is desired.

Moreover, a method different from the above direct coupling and lens coupling methods is proposed. In Japanese Patent Laid-Open Nos. Sho. 55-43538 and Sho. 60-173508, it is proposed to use a material whose refractive index changes by applying light to the material.

However, the optical coupler connection method proposed in Laid-Open No. Sho. 55-43538 includes a method for manufacturing an optical coupler characterized by applying light to the optical coupler substrate made of a material whose refractive index changes proportionally to a light intensity from a position where light should be inputted or outputted and changing the refractive index of the optical coupler substrate so as to form an optical waveguide in self-alignment. To use the optical coupler, it is necessary to arrange and secure optical parts including optical fibers to be coupled by the optical coupler. Therefore, for example, a hole for inserting an optical fiber is formed on the optical coupler.

In Laid-Open No. Sho. 60-173508, an optical waveguide connection method is proposed which is characterized by setting a phase-change-type photosensitive medium material between two waveguides facing each other, applying light to the photosensitive medium material from the both waveguides, and locally denaturalizing the photosensitive medium so as to form a waveguide for optical coupling.

This reference purposes to set a photosensitive medium material between waveguides to be mutually connected, form a waveguide for optical coupling in it, and thereby decrease a loss due to misalignment of optical axes and it is preferable to set the interval between waveguides to 0.1 mm or less and use ultraviolet rays as the light to be applied to the photosensitive medium material. As a result, though the light spreads due to diffraction in the photosensitive medium material, a waveguide for coupling with a small spread is formed. The optical coupling disclosed in the laid-open official this reference uses connection between waveguides formed in the photosensitive medium and misalignment between waveguides to be connected is also taken over between waveguides in the photosensitive medium. Therefore, it is impossible to correspond to a large misalignment exceeding a core diameter.

The following materials can be used for the optical coupler.

For example, gazette Laid-Open No. Sho. 55-43538 mentioned above discloses that a chalcogenide-based amorphous semiconductor or macromolecular material containing photopolymerizable monomer is used for the optical coupler and Laid-Open No. Sho. 60-173508 discloses that the photopolymer made by DU PONT LIMITED, Photoresist KPR (trade name) made by KODAK LOMITED, and U.V. 57 (trade name) made by OPTION CHEMICAL LIMITED are known.

The following are refractive-index imaging materials whose refractive indexes change by applying light to them.

For example, Japanese Patent Laid-Open No. Hei. 2-3081 discloses a material made of thermoplastic polymers, ethylene-based unsaturated monomers, and polymerization initiator. Japanese Patent Laid-Open No. Hei. 2-3082 discloses a material made of interpolymers containing such segments as polyvinyl acetate, polyvinyl butyral, polyvinyl acetal, and polyvinyl formal as the main part, or made of polymerizable binder selected among groups made of the mixture of the segments, ethylene-based unsaturated monomers, and an optical initiator. Japanese Patent Laid-Open No. Hei. 3-50588 discloses a material made of solvent-soluble fluorine-contained polymerizable binder, ethylene-based unsaturated monomers, and a photopolymerization initiator. Moreover, Japanese Patent Laid-Open No. Hei. 3-36582 discloses a material made of allyl diglycol carbonate, 2,2,-bis{3,5-dibromo-4-(2-mathasryroiloxiethoxy)phenyl} propane, and a photopolymerization initiator.

However, these materials have a low heat resistance because they use thermoplastic resin and methacryroil-based polymeric products as a binder.

SUMMARY OF THE INVENTION

It is an object of the present invention to provide an optical part coupling method for simplifying optical coupling between optical parts and improving optical coupling efficiency and also to provide a refractive-index imaging material used for optical coupling.

According to the present invention, a first optical waveguide is coupled with a second optical waveguide by relatively movably retaining the waveguides, facing the optical coupling faces of the waveguides with each other, and fusing the optical coupling faces of the waveguide to each other.

When the optical coupling faces of the first and second optical waveguides are fused, surface tension works on the fused portions. In this case, because the first and second optical waveguides are relatively movably retained, the first and second optical waveguides relatively move each other by the fact that the surface tension works on the fused portions.

Because the surface tension works so as to minimize the surface area of a fused object in general, the first and second optical waveguides move in the direction in which the surface areas of the fused portions of the waveguides are minimized. As a result, the waveguides are coupled under the state in which the optical axes of the waveguides are almost completely aligned and the optical coupling efficiency is maximized.

According to another aspect of the present invention, optical parts are optically coupled with each other by securing the coupling faces of optical parts so that the parts face each other at an interval, feeding an adhesive refractive-index imaging material between the optical parts, applying light to the material from at least one of the parts, and thereby forming a refractive index distribution having the beam-condensing lens effect.

To form the beam-condensing refractive-index distribution, it is necessary to keep the distance between the optical parts at 0.1 mm or more. This condition is contrary to the condition preferred to form a waveguide disclosed in Japanese Patent Laid-Open No. Sho. 60-173508. It is desirable to use a long-wavelength light for the light for forming a refractive index in order to increase the spread of a beam after emitted from the optical part. However, it is easier to increase the distance between the optical parts because the spread of the beam is also limited depending on a characteristic such as the photosensitive wavelength zone of the refractive-index imaging material.

Thus, the coupling efficiency between the optical parts is improved by a refractive-index imaging material, a high accuracy is not needed for alignment of the parts, and the yield is improved. Moreover, because the optical parts to be coupled are secured and the refractive-index imaging material is supplied before the refractive-index distribution is formed by using the light emitted from the optical part, the refractive-index distribution is formed in self-alignment in accordance with the positions where the optical parts are secured. Therefore, the optical parts can be secured by rough alignment and moreover, the labor for forming optical fiber inserting holes to arrange and secure the devices to be coupled is unnecessary.

According to still another aspect of the present invention, alicyclic epoxy, chain epoxy, organic denatured silicone, and copolymer having an ethylene unsaturated compound having a hydroxyl group at the end in its building block or copolymer having an ethylene unsaturated compound containing silicone in its building block are used as the binder constituting the refractive-index imaging material used for optical coupling of optical parts. Moreover, a mixture having multifunctional acrylate or multifunctional methacrylate and an ethylene unsaturated monomer containing aromatic rings or halogen are used as the optical reaction monomer constituting the refractive-index imaging material. Furthermore, an optical initiator is contained in the refractive-index imaging material.

The above refractive-index imaging material is able to form a refractive-index distribution only by applying light and moreover, able to core by heating a binder compound of applying light because a compound having the above reactive group can be used as a binder, and has a high durability. Furthermore, when using the refractive-index imaging material, a refractive-index distribution having a lens effect of a high refractive index is formed in accordance with a light intensity because the monomer density in the region where monomers are polymerized by applying light with a certain wavelength increases. After optical devices are coupled by using the refractive-index imaging material and a refractive-index distribution having a lens effect is formed by applying light from the optical devices, unreacted monomers in the material react by either light application or heating.

By using the above coupling method and refractive-index imaging material, optical parts are efficiently coupled by rough alignment.

BRIEF DESCRIPTION OF THE DRAWINGS

FIG. 15(a) is a perspective view showing the initial state of the optical coupling method of the eighth embodiment of the present invention and FIGS. 15(b) to 15(d) are sectional views showing the optical coupling method of the eighth embodiment of the present invention;

FIG. 16 is a sectional view showing another configuration of the optical coupling method of the eighth embodiment of the present invention;

Figure 1A:
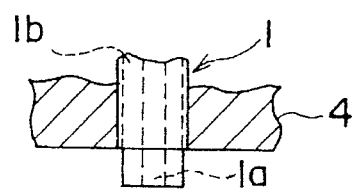
FIGS. 1(a) to 1(c) are side views showing an existing optical coupling method.

DESCRIPTION OF THE PREFERRED EMBODIMENTS (First Embodiment)

FIGS. 2(a), 2(b), 3(a) and 3(b) show the optical coupling steps of the first embodiment of the present invention.

In these figures, symbols 11 and 12 are first and second optical parts, and concretely they show optical fibers.

The optical fibers 11 and 12 comprise cores 11a and 12a in which light is confined, cladding 11b and 12b for concentrically enclosing the cores 11a and 12a, and jackets 11c and 12c for protecting the cladding 11b and 12b.

The refractive index of the cores 11a and 12a is larger than the refractive index of the cladding 11b and 12b. The light incoming from the edge of an optical fiber is confined in the cores 11a and 12a and propagates in the optical fiber.

The cores 11a and 12a and the cladding 11b and 12b use a fusible optical waveguide material. Though the optical waveguide material is not restricted as long as it is fused by heating and transparent for guided light, organic materials and glass are particularly desirable.

For example, organic materials include thermoplastic resins such as polymethyl methacrylate, polystyrene, polyester, polycarbonate, polyolefin, styrene-methylmethacrylate copolymer, styrene-acrylonitrile copolymer, and poly-4-methylpentene-1-polyvinyl chloride. Moreover, it is possible to use thermosetting or photo-curing resins such as epoxy resin, polyamide, crosslinkable polyester, crosslinkable polyacrylate, and silicon in order to improve the heat resistance and mechanical strength after fusion. Furthermore, it is possible to thermopolymerizable or photopolymerizable monomers such as styrene, methacrylate, acrylate, acrylic compound, and isocyanate compound.

It is also possible to use hybrid materials made by mixing the above resins and monomers.

Moreover, it is possible to properly add polymerization initiator to the mixed hybrid materials so as to quickly start polymerization by heat or light. Furthermore, it is possible to use a proper additive to the materials in order to adjust the properties such as the viscosity, fusing temperature, refractive index, and transparency of them. In this case, even if the material is liquid, it is possible to fuse it by increasing the viscosity of the material.

The glass material can use soda glass, pyrex, or quartz. It is also possible to add a proper additive to the material in order to adjust the properties of the material such as the fusing temperature, refractive index, and transparency.

The following is the description of optical coupling of an optical fiber.

An optical fiber 11 is set to a movable retainer 13. In the movable retainer 13, a fiber securing portion 13a is coupled with a movable fiber retaining portion 13b for retaining the optical fiber 11 by a spring 13c and the movable fiber retaining portion 13b is kept movable. The optical fiber 11 is secured to the movable fiber retaining portion 13b and kept movable relative to a fiber securing portion 13a.

The movable fiber retaining portion 13b is constituted so that it is movable from a fixed retainer 14 for retaining an optical fiber 12 in order to position the optical coupling face 11b (edges of the core 11a and clad 11b) of the optical fiber 11 and the optical coupling face 12d (edges of the core 12 and clad 12b) of the optical fiber 12. These optical coupling faces 11d and 12d are optically coupled to each other by moving the movable fiber retaining portion 13b of the movable retainer 13 from the fixed retainer 14, and facing and contacting the optical coupling face 11d and the optical coupling face 12d each other so that the faces are overlapped in at least 10% of the areas respectively.

When the optical fibers 11 and 12 contact each other, the position of the fiber securing portion 13a of the movable retainer 13 is fixed. In this case, it is not necessary to position the optical fibers so that the edges of the both fibers are accurately aligned.

Figure 3A:
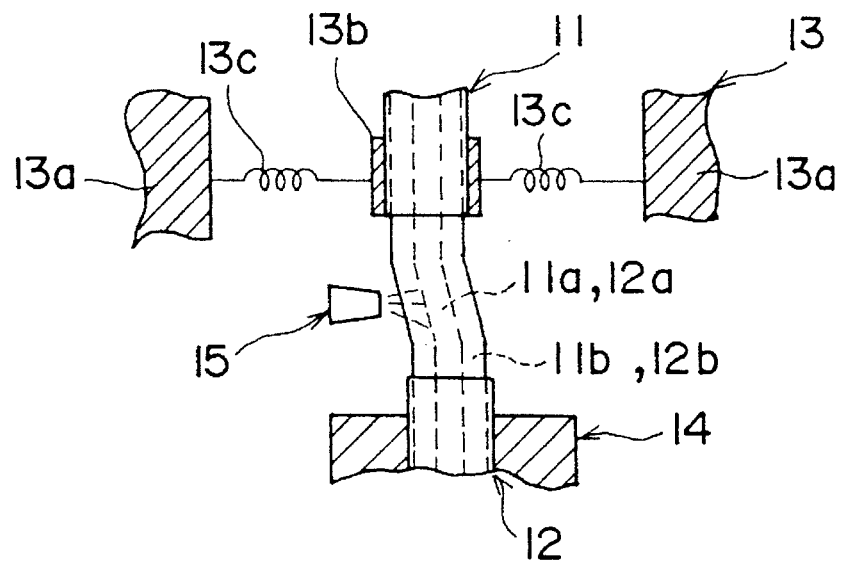
Figure 3B:
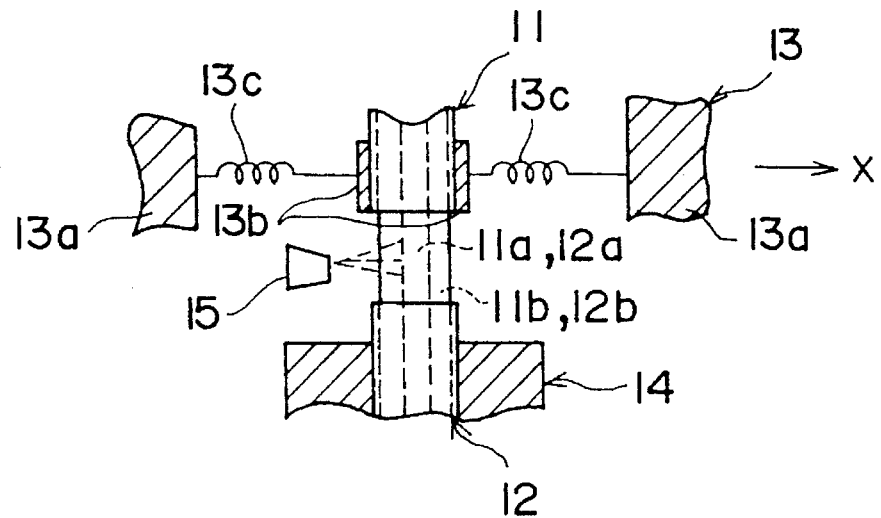

As shown in FIG. 3(a), the joint between the optical coupling face 11d of the optical fiber 11 and the optical coupling face 12d of the optical fiber 12 is heated by a heater 15 using arc discharge to fuse the cores 11a and 12a.

Thereby, the cores 11a and 12a and the clads 11b and 12b are fused and united into one body and surface tension works on the surfaces of cladding 11b and 12b to minimize the surface area of the side of the joint between the cladding 11b and 12b. The surface areas of the clads 11b and 12b are minimized when the center lines (optical axes) of the cores 11a and 12a are aligned.

Therefore, a force for aligning the center lines of the cores 11a and 12a works on the cores 11a and 12a and cladding 11b and 12b.

In this case, the optical fiber 11 is retained by the movable fiber retaining portion 13b so that it is movable and the optical fiber 12 is secured by the fixed retainer 14. Therefore, a force for aligning the center lines of the optical fibers 11 and 12 works, the optical fiber 11 moves in the direction of the arrow X in FIG. 3(b), and the center lines of the optical fibers 11 and 12 are aligned.

When heating is stopped, the optical fibers 11 and 12 are coupled with each other with their center lines aligned. When the center lines are aligned, the optical coupling efficiency increases because the optical coupling faces 11d and 12d are aligned. It is also possible to forcibly cool the optical fibers 11 and 12 as soon as heating is stopped.

Because the optical coupling faces 11d and 12d of the optical fibers 11 and 12 are automatically aligned by the surface tension of the fused portion by using the movable retainer 13 for movably retaining the optical fiber 11 and contacting and fusing the optical faces 11d and 12d of the optical fibers 11 and 12 with each other, a high optical coupling efficiency is obtained without performing the existing laborious accurate alignment.

The cores 11a and 12a and cladding 11b and 12b are made of a hydrophobic material or provided with hydrophobic treatment and the jackets 11c and 12c are made of a hydrophilic material or provided with hydrophilic treatment. Thus, because the hydrophobic material and hydrophilic material hardly get intimate with each other, fused cores 11a and 12a and cladding 11b and 12b do not spread on the jacket 11c and thereby the cores 11a and 12a and clads 11b and 12b are optically coupled at a high yield.

The hydrophobic material is an organic material having "—OH" group and "—COOH" group in its molecule, which includes polyvinyl alcohol, polyphenol, polyvinyl butyral, polyvinyl formal, and copolymer of them. The hydrophobic treatment is to coat a surface with a hydrophobic material.

The hydrophilic material is an organic material having no or a little "—OH" or "—COOH" group but having "—F" in its molecule, which includes fluorine resin, polystyrene, polycarbonate, and silicon resin. The hydrophilic treatment is to coat a surface with a hydrophilic material.

(Second Embodiment)

Figure 4:
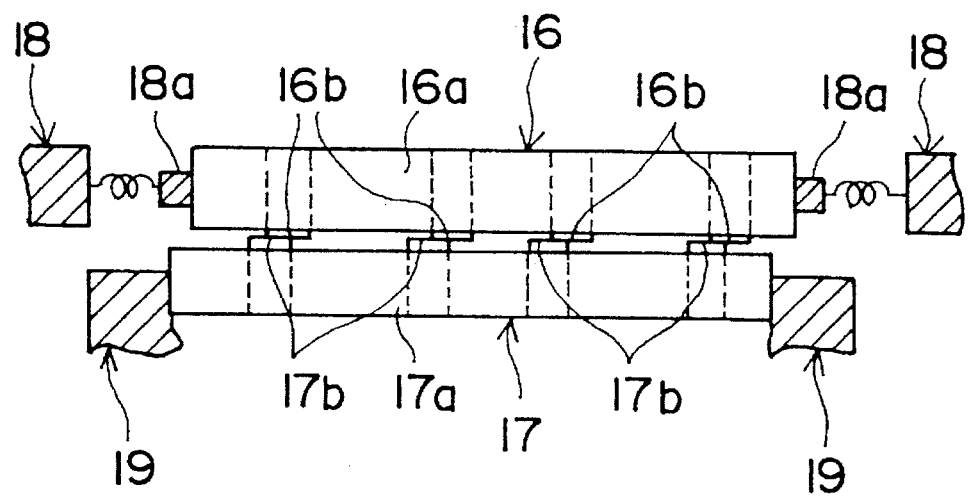
FIG. 4 is a side view showing the optical coupling method of the second embodiment of the present invention.

FIG. 4 shows a sectional view of the second embodiment of the present invention.

In FIG. 4, symbols 16 and 17 represent optical waveguide plates. The basic materials 16a and 17a of them correspond to the cladding 11b and 12b shown in FIGS. 1 and 2, which are made of the same material as the cladding 11b and 12b. A plurality of optical waveguides 16b and 17b formed in the basic materials are made of the same material as the cores 11a and 12a.

The basic material 16a of the optical waveguide plate 16 is retained by a movable retaining portion 18a of a movable retaining stage 18. The basic material 17a of the optical waveguide plate 17 is retained by a fixed retaining stage 19. These optical waveguide plates 16 and 17 are arranged so that they face each other and the optical waveguides 16b and 17b at the facing side are protruded from the basic materials 16a and 17a and formed so that they are at least partially overlapped.

By facing and fusing a plurality of optical waveguides 16b and a plurality of optical waveguides 17b, the optical waveguides 16b and optical waveguides 17b faced each other are automatically aligned by a surface tension generated when they are fused and optically coupled at a high efficiency similarly to the description for FIGS. 2 and 3.

Though the optical waveguide plate 16 is retained by the movable retaining stage 18 in the above description, it is also possible to fuse the optical waveguides 16b and 17b by movably mounting the optical waveguide plate 16 on the optical waveguide plate 17 and contacting the optical waveguides 16b of the plate 16 with the optical waveguides 17b of the plate 17. In this case, because the optical waveguide plate 16 is not fixed, it moves on the optical waveguide plate 17 and alignment is automatically performed according to the same principle as the case of the first embodiment.

(Third Embodiment)

Figure 5:
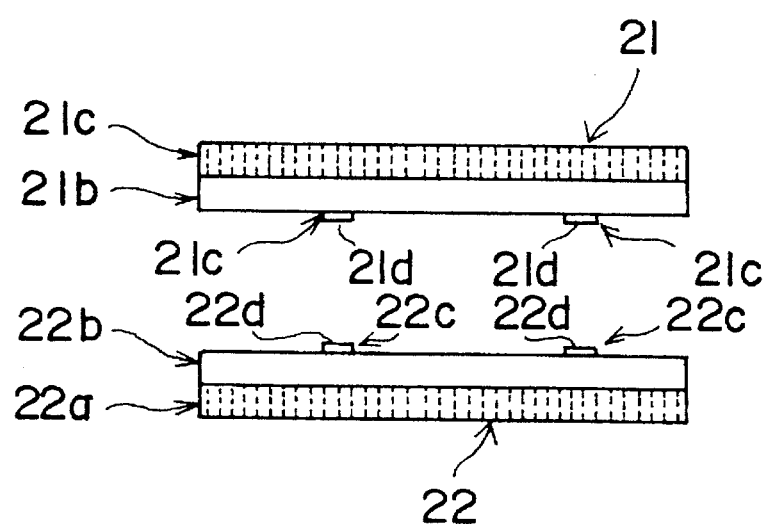
FIG. 5 is a side view showing the initial state of the optical coupling method of the third embodiment of the present invention.
Figure 6:
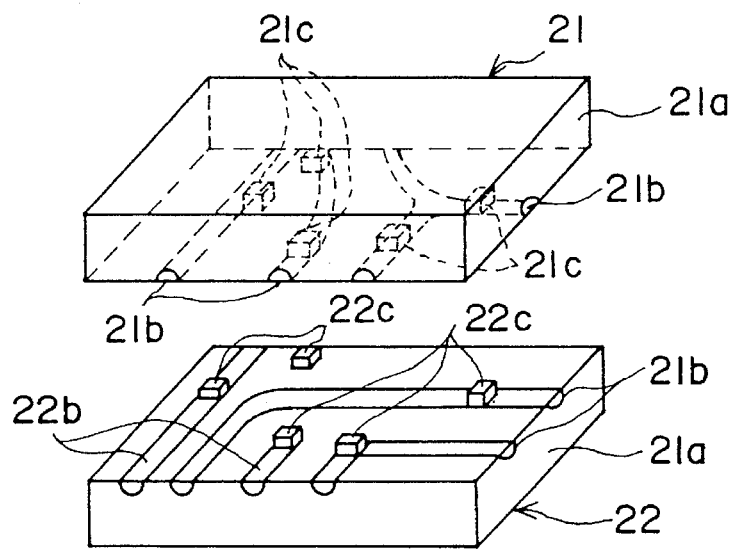
FIG. 6 is a perspective view showing the initial state of the optical coupling method of the third embodiment of the present invention.

In FIGS. 5 and 6, symbol 21 represents an optical waveguide plate serving as a first optical part and 22 represents an optical waveguide plate serving as a second optical part.

The optical waveguide plate 21 has a structure in which an optical waveguide 21b is formed on a basic material 21a. An optical coupling portion 21c is protruded and formed at a plurality of positions on the optical waveguide 21b. The optical coupling portion 21c is made of the same material as the optical waveguide 21b, which is applied to and formed on the optical waveguide 21b after the optical waveguide 21b is formed on the basic material 21a.

The optical waveguide plate 22 has a structure in which an optical waveguide 22b is formed on a basic material 22a. On the optical waveguide 22b, an optical coupling portion 22c is protruded and formed at a position corresponding to the optical coupling portion 21c formed on the optical waveguide 21b of the optical waveguide plate 21. The optical coupling portion 22c is made of the same material as the optical waveguide 22b, which is formed by applying it onto the optical waveguide 22b.

Figure 7A:
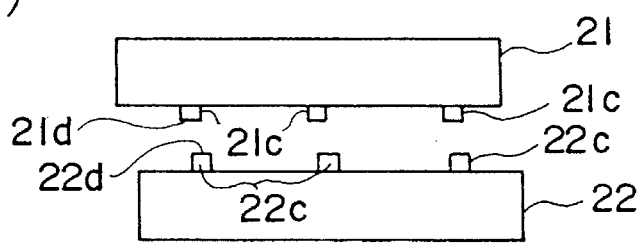
FIGS. 7(a) to 7(c) are side views showing the steps of the optical coupling method of the third embodiment of the present invention.
Figure 7B:
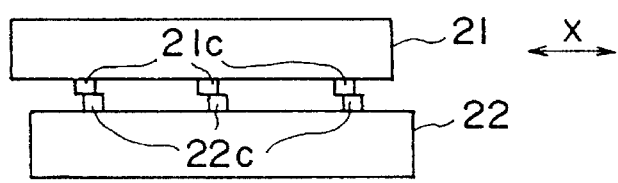
Figure 7C:
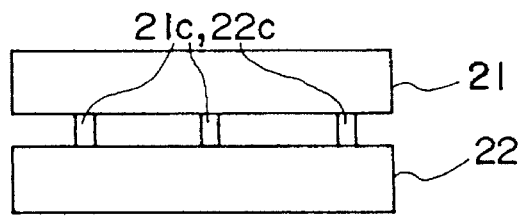

FIGS. 7(a) to 7(c) show the optical coupling steps of the third embodiment of the present invention.

As shown in FIGS. 7(a) to 7(c), the optical waveguide plate 22 is almost horizontally fixed so that the optical coupling portion 22c is turned upward. Then, as shown in FIG. 7(b), the waveguide plate 21 is mounted on the waveguide plate 22 so that the optical coupling face 21d of the optical coupling portion 21c of the optical waveguide plate 21 and the optical coupling face 22d of the optical coupling portion 22c of the optical waveguide plate 22 are faced each other. In this case, the optical coupling faces 21d and 22d may be slightly misaligned.

Then, as shown in FIG. 7(c), the optical coupling portions 21c and 22c which are faced and contacted are fused to couple the optical waveguide s 21b and 22b faced each other. In this case, because the optical waveguide plate 21 is only mounted on the optical waveguide plate 22, they are automatically positioned by the surface tension when the optical coupling portions 21c and 22c are fused. Thus, the optical coupling portions 21c and 22c can optically be coupled securely and efficiently. It is possible to forcibly cool them after they are positioned.

(Fourth Embodiment)

Figure 8:
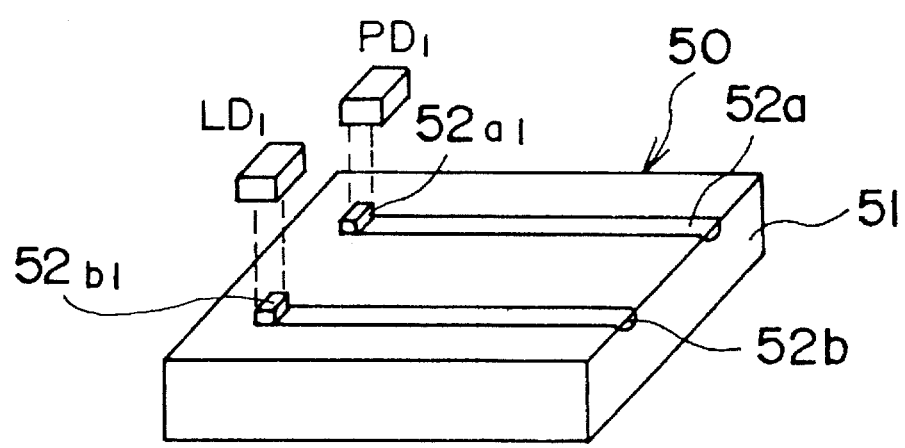
FIG. 8 is a side view showing the initial state of the optical coupling method of the fourth embodiment of the present invention.

FIG. 8 shows a perspective view of the fourth embodiment of the present invention. In FIG. 8, an optical waveguide plate 50 has optical waveguides 52a and 52b formed on a basic material 51.

Optical coupling faces 51a1 and 52b1 protruded from the surface of the basic material 51 are formed at the optical coupling portions of the optical waveguides 52a and 52b. These optical coupling faces 51a1 and 52b1 are formed by removing the optical waveguides 52a and 52b through etching or the like. A photodiode PD1 is optically coupled with the optical coupling face 52a1 and a semiconductor laser LD1 is optically coupled with the optical coupling face 52b1.

FIG. 9(a) to 9(d) shows optical coupling step diagrams of the fourth embodiment of the present invention.

The optical coupling method for the photodiode PD1 and the semiconductor laser LD1 is the same as that for the optical waveguide 52a with the optical waveguide 52b. Therefore, the optical coupling method for the semiconductor laser LD1 is described below.

Figure 9:
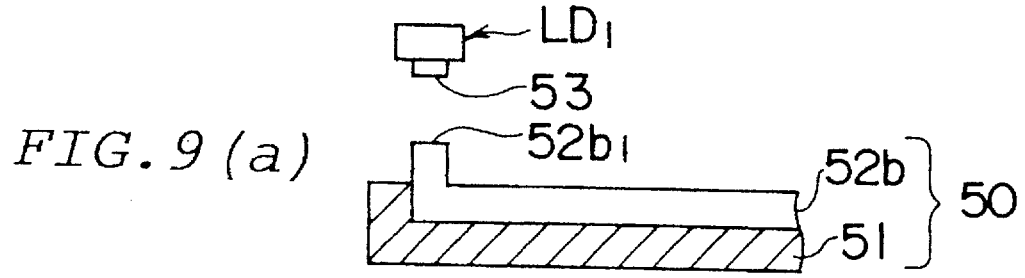
FIGS. 9(a) to 9(d) are side views showing the steps of the optical coupling method of the fourth embodiment of the present invention.
Figure 9:
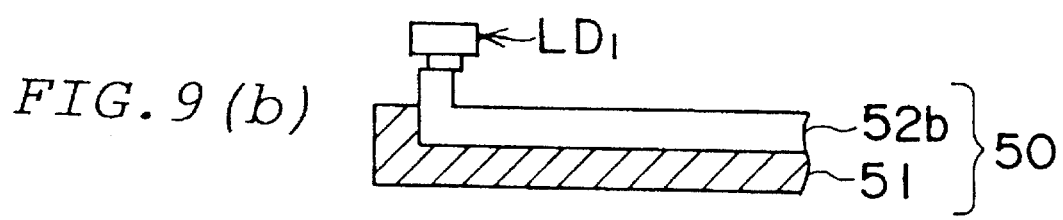
Figure 9:
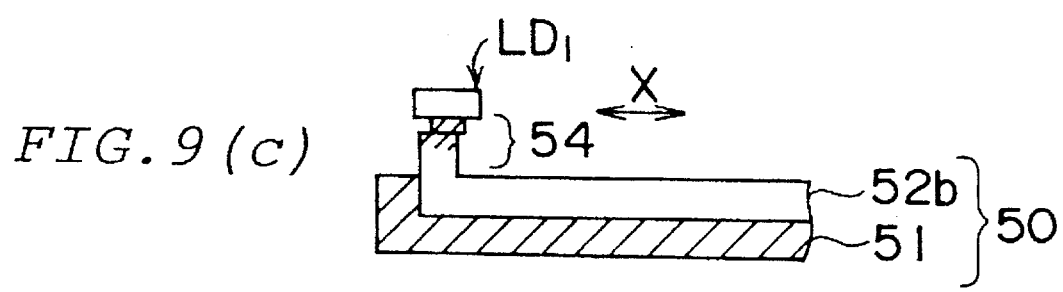
Figure 9:
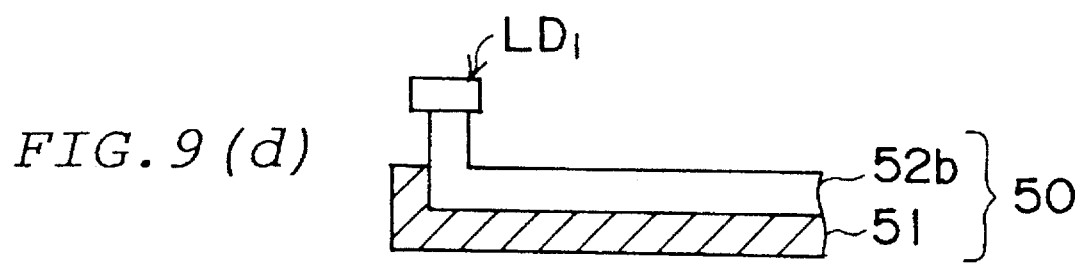

First, as shown in FIG. 9(a), the optical waveguide 50 is supported so that the optical coupling face 52b1 becomes approximately horizontal.

Then, as shown in FIG. 9(b), the semiconductor laser LD1 is mounted on the optical coupling face 52b1 in a free state so that the optical coupling face 53 of the laser LD1 is butted against the optical coupling face 52b1 of the optical waveguide 52b in 10% of the areas respectively.

Thereafter, as shown in FIG. 9(c), the optical coupling portion 54 is heated by the heating method previously described. In this case, because the semiconductor laser LD1 is mounted on the optical coupling face 52b1 in a free state, the optical axis of the LD1 is automatically adjusted to the optical coupling face 52b1 by the surface tension generated on the optical coupling portion 54 when the optical coupling portion 54 fuses. As a result, as shown in FIG. 9(d), the optical coupling face 53 of the semiconductor laser LD1 and the optical coupling face 52b1 of the optical waveguide 52b are aligned and fused. Therefore, because the semiconductor laser LD1 and the optical waveguide 52b are optically coupled without misalignment of optical axes, optical coupling is performed securely and efficiently.

After positioning is completed, it is permitted to perform forcible cooling.

(Fifth Embodiment)

Figure 10:
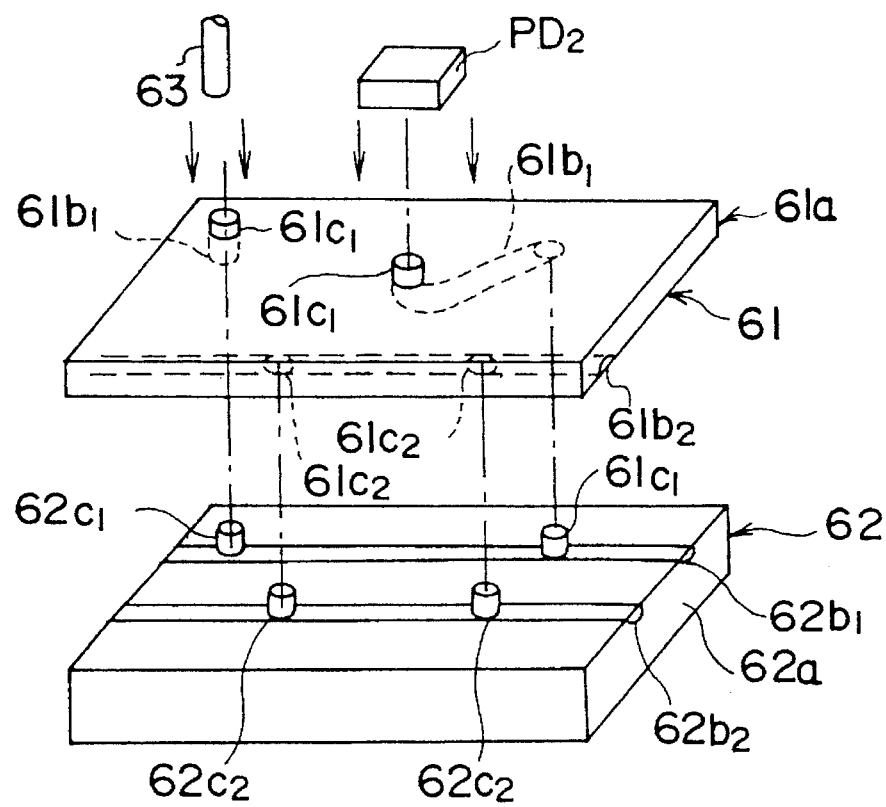
FIG. 10 is a side view showing the optical coupling method of the fifth embodiment of the present invention.

FIG. 10 shows a perspective view of the fifth embodiment of the present invention.

In FIG. 10, symbols 61 and 62 represent optical waveguides, 63 represents an optical fiber, and PD2 represents an light-emitting diode.

This embodiment optically couples an optical waveguide plates 61 and 62 and also optically couples an optical waveguide plate 61, optical fiber 63, and light-emitting diode PD2.

An optical waveguide 62 is made by forming an optical waveguide 62b1 and 62b2 in a basic material 62a and an optical coupling portions 62c1 and 62c2 is protruded from and formed on the optical waveguides 62b and 62b2. The optical coupling portions 62c1 and 62c2 is formed by applying the same material as the optical waveguides 62b.

The optical waveguide plate 61 is made by forming the optical waveguides 61b1 and 61b2 in the basic material 61a and optically coupled with the optical waveguides 62b1 and 62b2. An optical waveguide 61b1 passing from one face through the other face of the optical waveguide plate 61 and an optical waveguide 61b2 formed on the one face are present on the optical waveguide plate 61.

An optical coupling portion 61c1 is formed on the optical waveguide 61b1 by applying the same material as the optical waveguide 61b1 to the one face of the optical waveguide plate 61, the optical coupling portion 61c1 is optically coupled with an optical fiber 63 and the light-emitting diode PD2, and the optical waveguide 61b1 is optically coupled with the optical waveguide 62b1 of the optical waveguide plate 62 at the other face of the optical waveguide plate 61.

The optical waveguide 61b2 is optically coupled with the optical waveguide 62b2 through the optical coupling portions 61c2 and 62c2.

The optical waveguide plates 61 and 62 are optically coupled with each other at a high efficiency through the steps described in the third embodiment. The optical waveguide plate 62 and optical fiber 63 are optically coupled with the optical coupling portions 61c1 and 62c2 at a high efficiency through the steps described in the first embodiment. The light-emitting diode PD2 is optically coupled with the optical coupling portion 61c1 at a high efficiency through the steps described in the fourth embodiment.

As described above, it is possible to easily perform optical coupling of a plurality of optical parts by putting one optical part on another.

(Sixth Embodiment)

Figure 11:
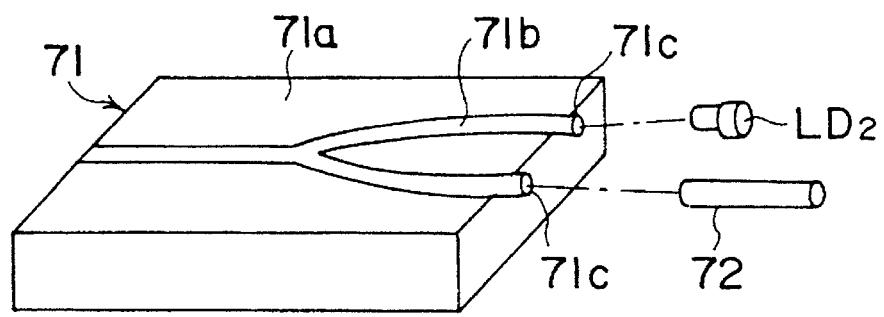
FIG. 11 is a perspective view showing the initial state of the optical coupling method of the sixth embodiment of the present invention.

FIG. 11 shows a perspective view of the sixth embodiment of the present invention.

In FIG. 11, symbol 71 represents an optical waveguide plate. The optical waveguide plate 71 is made by forming an optical waveguide 71b in a basic material 71a. The optical waveguide 71b is protruded from the edge of the basic material 71a and the protruded portion forms an optical coupling portion 71c. The optical coupling portion 71c is formed by etching, for example, the edge of the basic material 71a.

It is also possible to form the optical coupling portion 7c by applying it.

The optical coupling portion 71c is optically coupled with an optical fiber 72 and semiconductor laser LD2.

Figure 12A:
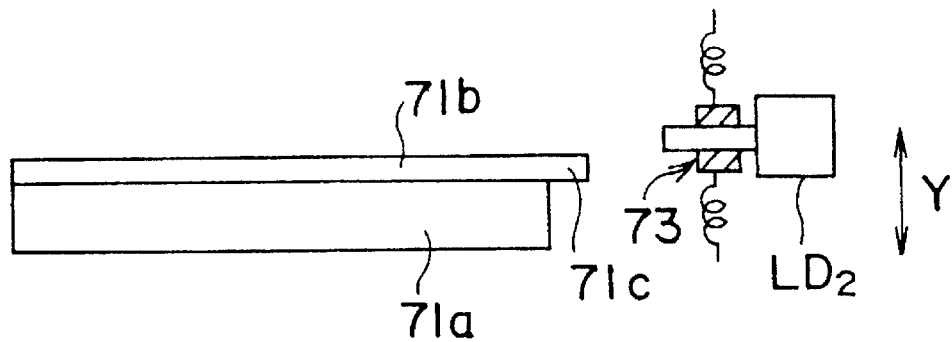
FIGS. 12(a) to 12(c) are side views showing the steps of the optical coupling method of the sixth embodiment of the present invention.
Figure 12B:
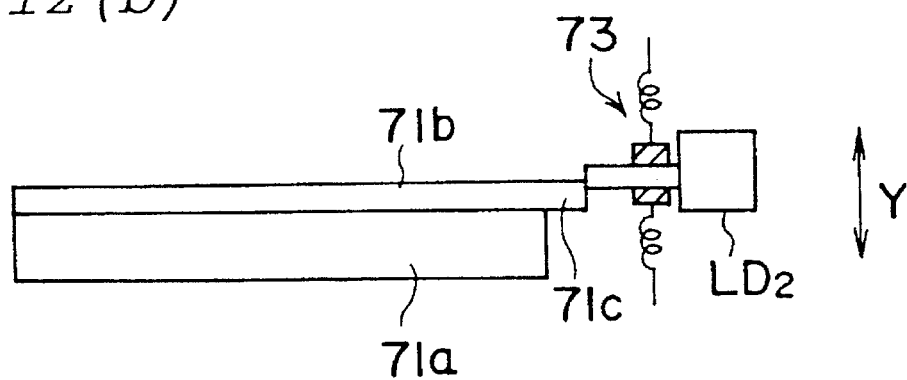
Figure 12C:
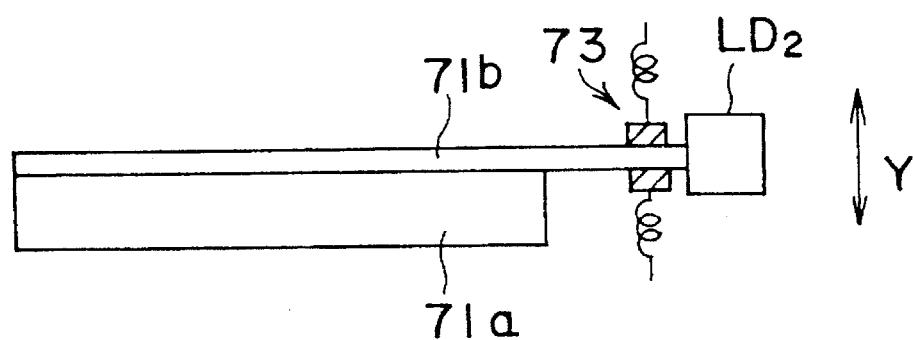

FIGS. 12(a) to 12(c) show the optical coupling steps of the sixth embodiment of the present invention. Because the optical fiber 72 and semiconductor laser LD2 are optically coupled in the approximately same steps, only the optical coupling steps of the semiconductor laser LD2 and optical coupling portion 71c are described below.

Figure 1B:
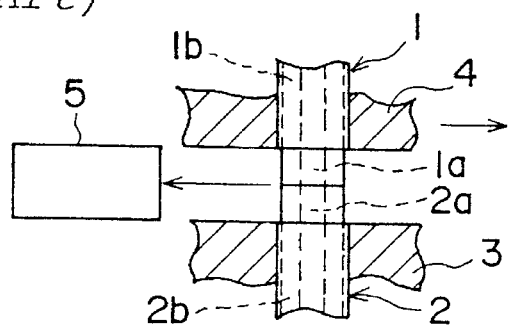
Figure 1C:
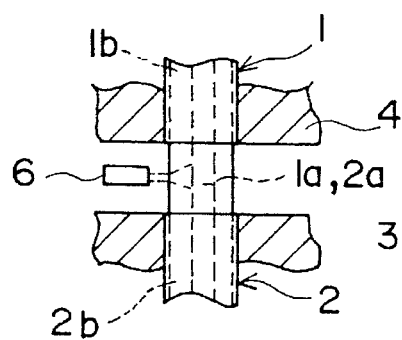
Figure 2A:
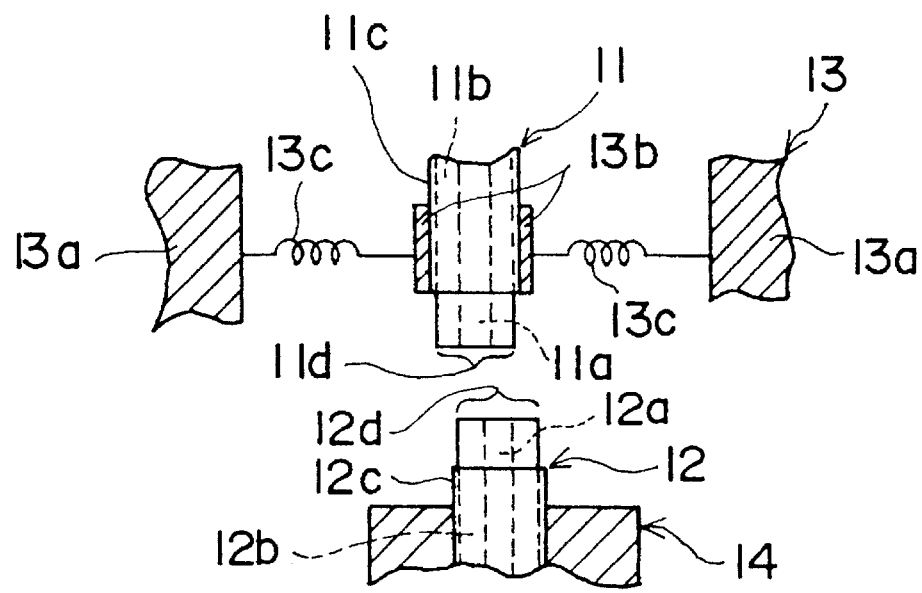
FIGS. 2(a) and 2(b) and 3(a) and 3(b) are side views showing the steps of the optical coupling method of the first embodiment of the present invention.
Figure 2B:
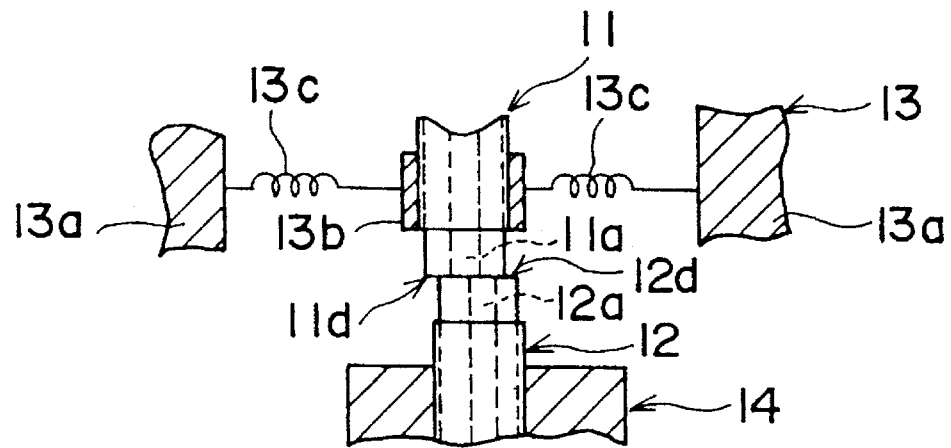

First, as shown in FIG. 12(a), the semiconductor laser LD2 is retained by a movable retaining portion 73 having a constitution almost same as the movable retainer 13 shown in FIG. 1 so that it is movable in the direction of the arrow Y. Then, as shown in FIG. 11(b), the light emitting face of the semiconductor laser LD2 is butted against the optical coupling face of the optical coupling portion 71c so that they are overlapped each other in at least 10% of the areas respectively.

Then, as shown in FIG. 12(c), the light emitting face of the semiconductor laser LD2 is fused with the optical coupling portion 71c. In this case, because the semiconductor laser LD2 is movably retained in the direction of the arrow Y, the core position is automatically adjusted by the surface tension in fusing and optical coupling is performed securely and efficiently.

After the positioning is completed, the fused portion is cooled.

(Seventh Embodiment)

Figure 13:
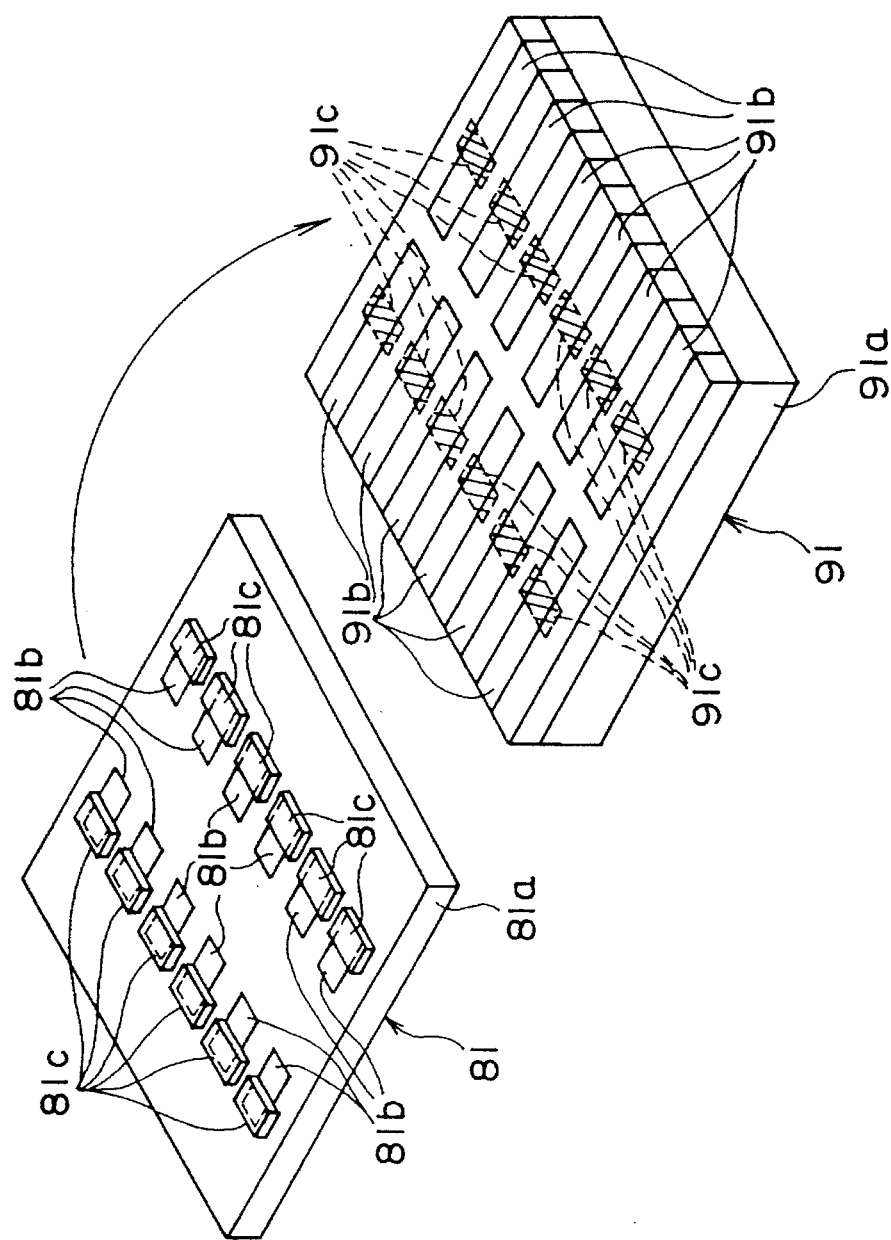
FIG. 13 is a perspective view showing the initial state of the optical coupling method of the seventh embodiment of the present invention.

FIG. 13 shows a perspective view of the seventh embodiment of the present invention.

In FIG. 13, symbol 81 represents a photodiode array and 91 represents an optical waveguide plate.

The photodiode array 81 is constituted by forming a plurality of photodiodes 81b on a semiconductor substrate 81a. The optical waveguide plate 91 is constituted by forming a plurality of optical waveguides 91b on a basic material 91a at the same intervals as the photodiodes 81b on the substrate 81a.

The photodiode 81b is coated with an optical coupling portion 81c protruded from the photodiode array 81. The optical coupling portion 81c is made of a thermoplastic or photo-curing polymer.

At a position to which the optical coupling portion 81c of the photodiode 81b is connected on the optical waveguide plate 91, a surface treated portion 91c applied with hydrophilic or hydrophobic surface treatment different from the periphery of the position is formed. It is also possible to apply the surface treatment to both the photodiode array 81 and optical waveguide plate 91. Moreover, it is possible to apply the surface treatment not to an optical coupling face but to the periphery of the face.

It is possible to form an optical coupling portion made of a thermoplastic or photo-curing polymer in the optical coupling area of not the photodiode array 81 but the optical waveguide plate 91, or in the optical coupling areas of both the photodiode array 81 and optical waveguide plate 91.

FIGS. 14(a) to 14(d) show optical coupling step diagrams of the seventh embodiment of the present invention.

Figure 14:
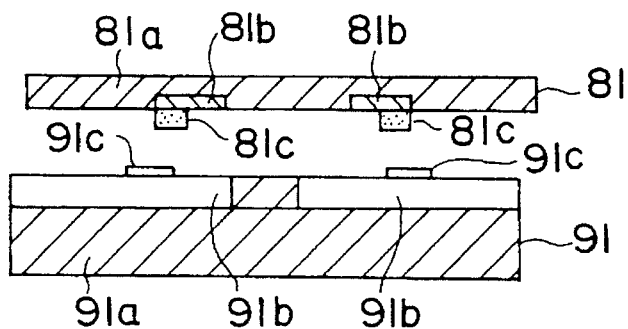
FIGS. 14(a) to 14(d) are side views showing the steps of the optical coupling method of the seventh embodiment of the present invention.
Figure 14:
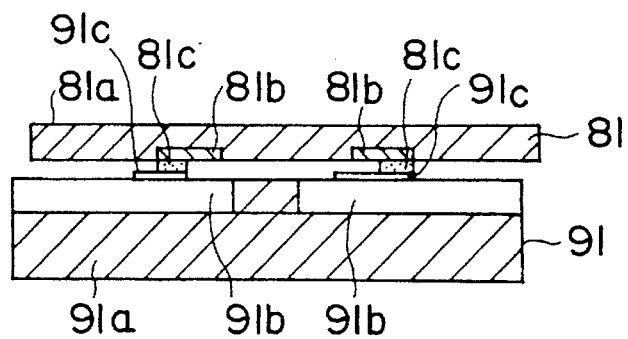
Figure 14:
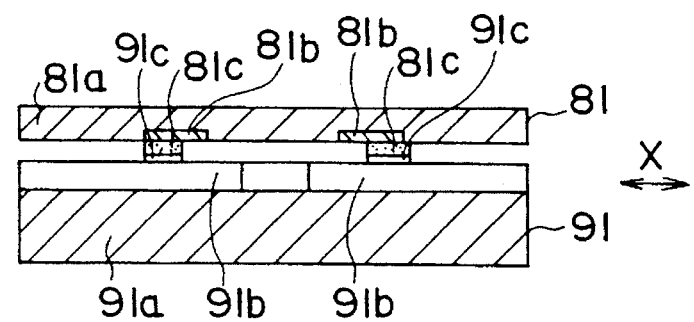
Figure 14:
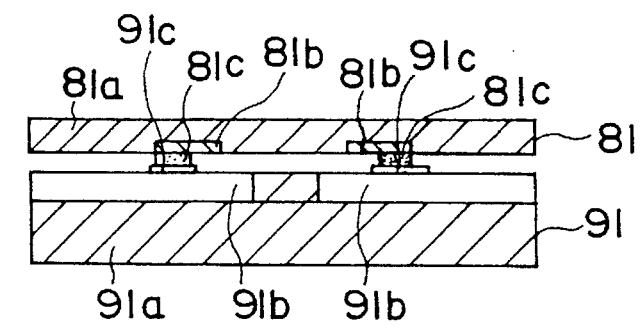

First, as shown in FIG. 14(a), the optical waveguide plate 91 is kept approximately horizontal so that the optical waveguide 91b turns upward. Thereafter, as shown in FIG. 14(b), the photodiode array 81 is mounted on the optical waveguide plate 91 so that the optical coupling portion 81c of the photodiode array 81 faces the optical waveguide 91b of the optical waveguide plate 91.

As shown in FIG. 14(c), when the optical coupling portion 81c is fused, the photodiode 81 moves horizontally {in the direction of the arrow X in FIG. 14(c)} and the optical coupling portion 81c and surface treated portion 91c are positioned. And, by cooling the optical coupling portion 81c and surface treated portion 91c, the photodiode array 81 is optically coupled with the optical waveguide plate 91 as shown in FIG. 14(d).

After they are positioned, fused portions are cooled.

Through the above steps, the photodiode array 81 and optical waveguide plate 91 are automatically positioned and optically coupled each other securely and efficiently.

Optical parts to be optically coupled by the optical coupling method of the present invention are not restricted to those used for the first to seventh embodiments.

Moreover, combinations of optical parts are not restricted to those in the first to seventh embodiments.

(Eighth Embodiment)

FIGS. 15(a) to 15(d) are sectional views showing the optical part coupling method of the first embodiment of the present invention.

First, as shown in FIG. 15(a), optical fibers 103 and 104 are set to a V-groove 102 of a support substrate 101 to secure them by facing them each other and giving a gap between the edges of them. In this case, the distance between the fiber edges is set to 0.1 mm or more.

Then, a refractive-index imaging material whose refractive index increases by applying a light with a specific wavelength and which is dissolved in a solvent is dripped into the gap between the edges of the optical fibers 103 and 104 and their periphery as shown in FIG. 15(b). Then, they are left as they are for several hours to dry them.

The refractive-index imaging material uses, for example, a material containing an alicyclic compound or chain compound having an epoxy group, ethylene unsaturated compound having an aromatic ring or halogen, multifunctional acrylate or methacrylate, and photopolymerization initiator. Other materials are described in later embodiments.

Thereafter, light is applied to the refractive-index imaging material 105 from at least one of the optical fibers 103 and 104. Though it is desirable that the wavelength of the light is long, the wavelength is concretely selected by considering the photosensitive wavelength zone of the refractive-index imaging material 105.

It is estimated that a high refractive-index image is formed because polymerization of photopolymerizable monomers having a high refractive index at a portion exposed to the light starts, the monomer density is increased due to the polymerization, and a refractive-index difference occurs between the above portion and a portion at a low monomer density not exposed to the light. Refractive-index imaging materials constituting the refractive-index imaging material 105 are concretely described in later embodiments.

Thereby, a high refractive-index image 106 based on the intensity distribution of the light emitted from the optical fibers 103 and 104 is formed in the refractive-index imaging material 105. Concretely, when light is emitted from the optical fiber 103, a horn-shaped high refractive-index image 106 in which the diameter increases starting with its core is formed as shown in FIG. 15(c). When light is emitted from both the optical fibers 103 and 104, a high refractive-index image 106a with a shape whose central portion is the widest such as a rhombus is formed as shown in FIG. 16.

Thereafter, unreacted monomers in the refractive-index imaging material 105 are made to react by applying light such as ultraviolet rays to or heating the material to stabilize and cure the material according to necessity. When applying light to the refractive-index imaging material 105, it is possible to destroy pigments remaining in the material 105 and increase the light transmittance.

Through the above steps, the optical fibers 103 and 104 are optically coupled each other and bonded to the support substrate 101.

And, when the horn-shaped high refractive-index image 106 is formed in the refractive-index imaging material 105 present between the edges of the optical fibers 103 and 104 and signal light is applied into the widest edge of the high refractive-index image 106 from the optical fiber 104 contacting the widest edge, the light collects to the narrowest portion of the high refractive-index image 106 according to the lens effect of the image 106 and enters the core of the optical fiber 103. In general, signal light uses an infrared beam of a semiconductor laser or the like. However, because there are only a few materials sensing the infrared beam, the wavelength is frequently different from that of the light for forming the refractive-index image 106.

As a result, a high coupling efficiency is obtained by the light absorbing function of the refractive-index image 106 even if the accuracy for aligning the optical fibers 103 and 104 is moderate.

Moreover, a high isolation characteristic is obtained by increasing the interval between the edges of the optical fibers 103 and 104 and the coupler length.

The following is the analysis result obtained by the two-dimensional waveguide analysis method using Fourier transform {Thesis of DENSHI TSUSHIN GAKKAI: J66-C, 10(1983)72}.

Figure 17:
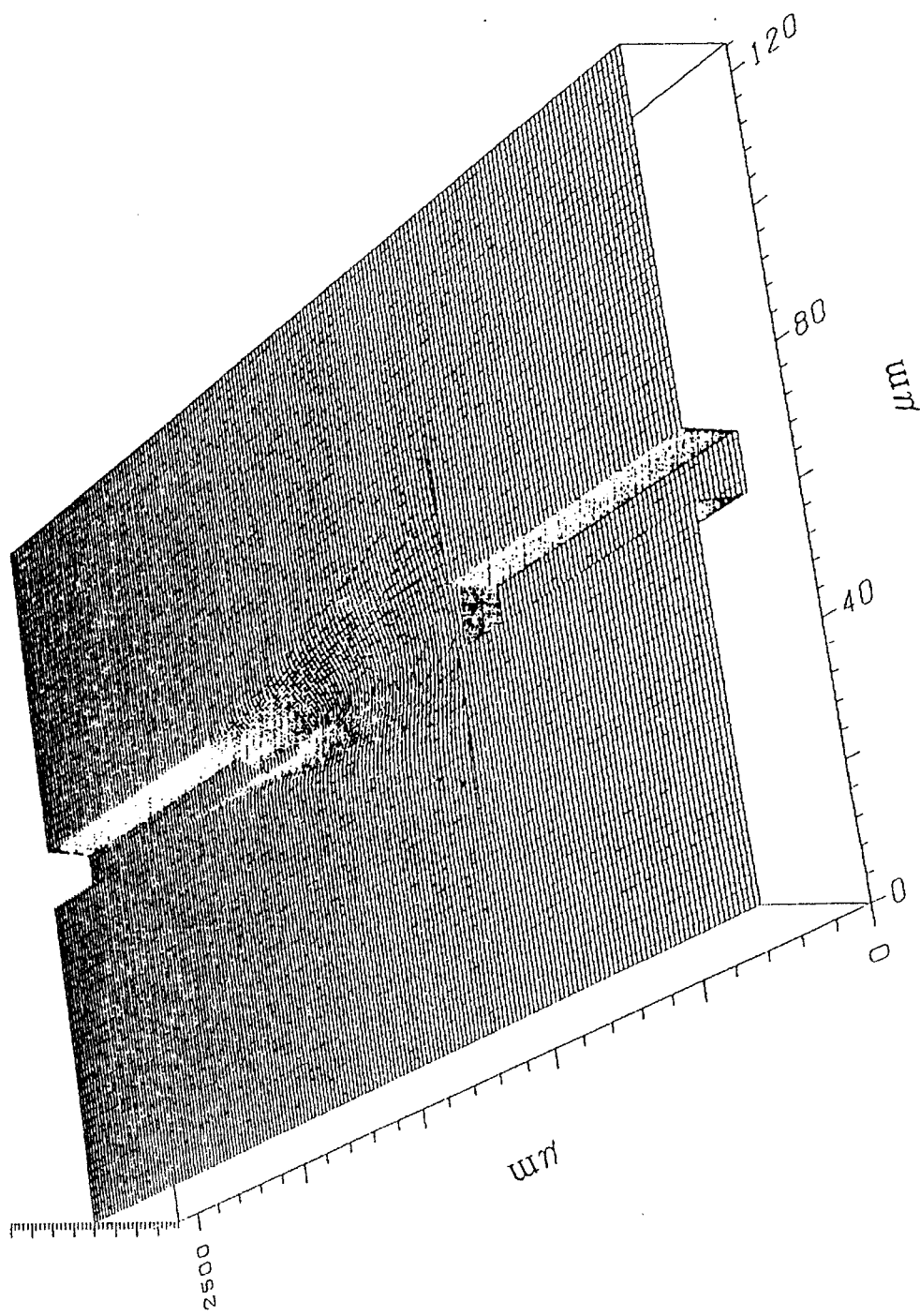
FIG. 17 is a refractive-index distribution diagram between optical parts coupled by the eighth embodiment of the present invention.

When it is assumed that a refractive-index distribution corresponding to a light intensity distribution is formed in the refractive-index imaging material 105, the refractive-index distribution shown in FIG. 17 is obtained after applying the light for forming a high refractive-index image from either optical core. In this analysis example, the core diameter of an optical fiber is assumed as 10 μm, distance between cores as 1,000 μm, misalignment value of optical axes between core layers as 0 μm, refractive index of a core layer as 1.60, refractive index of a clad as 1.58, wavelength of light applied to the material as 488 nm, refractive index of the periphery of the material after forming a refractive-index image as 1.58, and refractive-index difference between high refractive-index image of the material and its periphery as 0.01.

Figure 18:
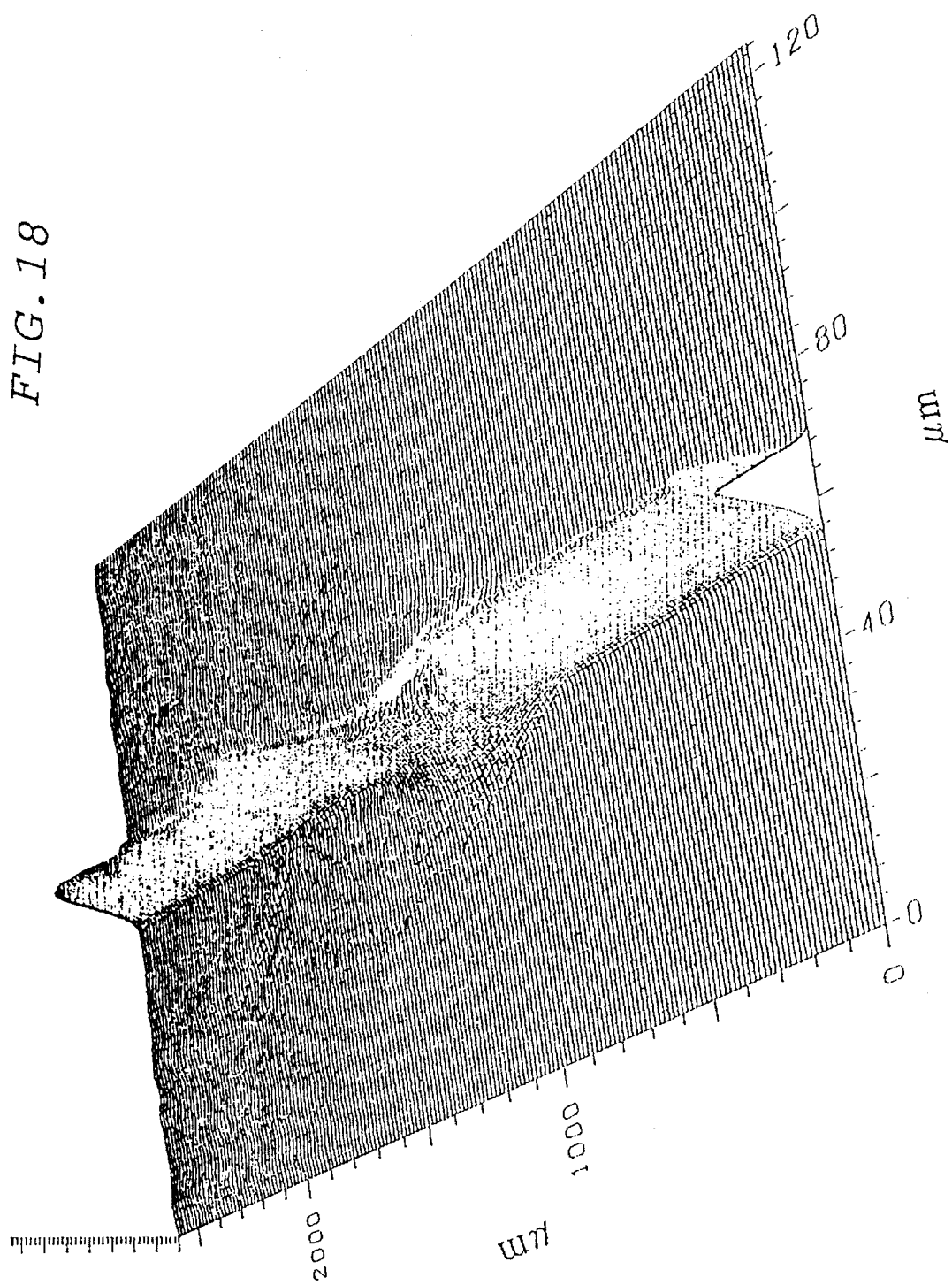
FIG. 18 is an illustration showing a light propagation pattern between optical parts coupled by the eighth embodiment of the present invention.

As the result of applying the light with the wavelength of 1.3 μm to a refractive-index image material with the above refractive-index distribution from the core of the optical fiber 103, the light propagation pattern shown in FIG. 18 is obtained and the light is collected to the core of the optical fiber 104 by a high refractive-index image. When excluding the optical loss due to light absorption and scattering by the refractive-index imaging material 105, a theoretical coupling efficiency of 90% or more is obtained.

When coupling optical parts such as optical fibers, semiconductor lasers, optical waveguides, or light amplifiers each other, tolerances for misalignment of optical axes and angle formed between axes are increased by using the above method.

Figure 19:
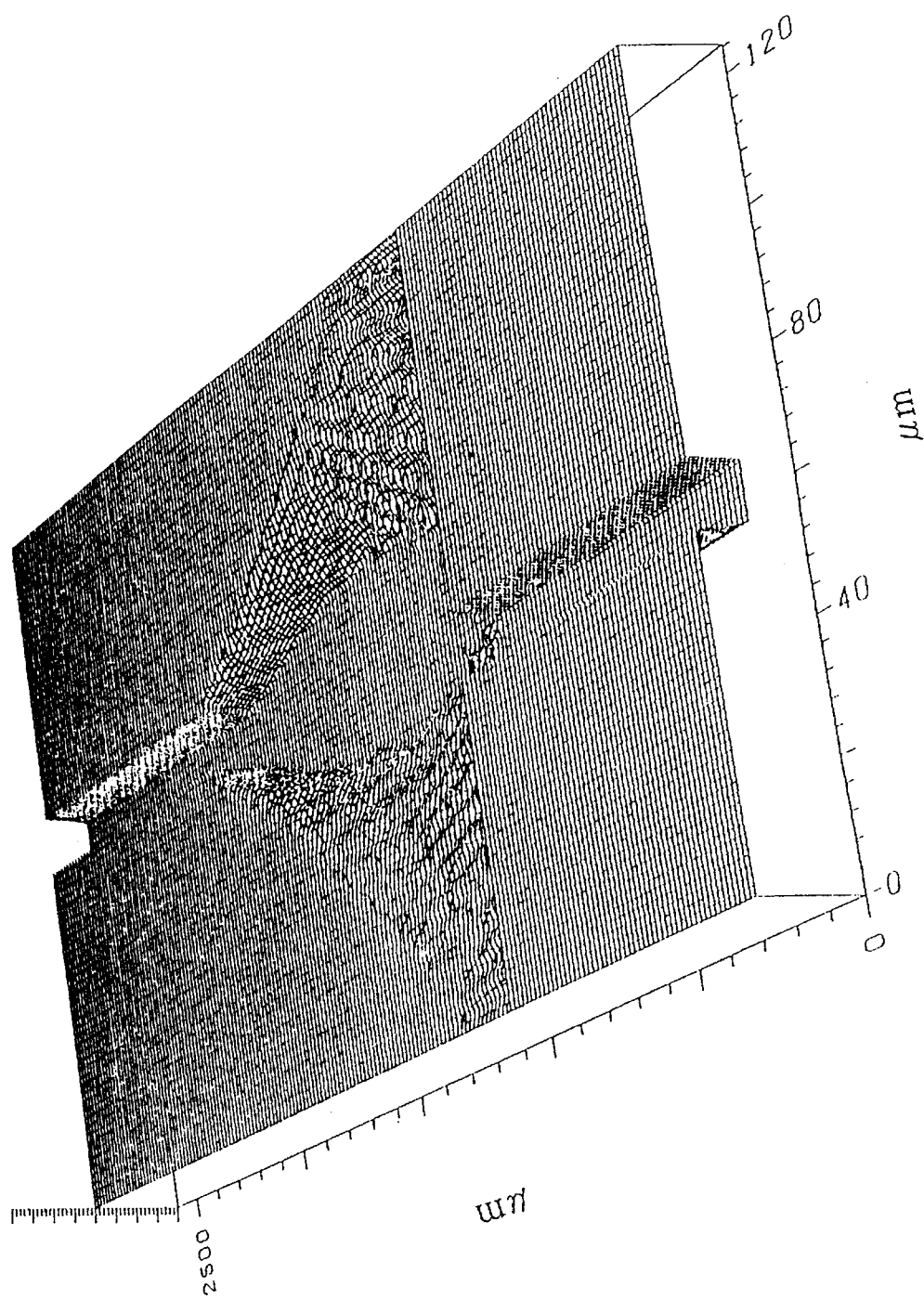
FIG. 19 is a refractive-index distribution diagram between optical parts with misalignment of optical axes coupled by the eighth embodiment of the present invention.

For example, when the optical axes of core layers are misaligned by 10 μm, the refractive-index distribution shown in FIG. 19 is obtained after applying the light for forming a high refractive-index image from either optical core.

In this example, the distance between core layers of the optical fibers 103 and 104 is assumed as 1,000 μm, each core diameter as 10 μm, refractive index of a core layer as 1.60, refractive index of a clad as 1.58, wavelength of the light applied to a refractive-index imaging material as 1.3 μm, refractive index of the periphery of the refractive-index imaging material as 1.58, and refractive-index difference between high refractive-index image of the material and its periphery as 0.01.

Also for the optical axis misalignment value of 10 μm, a theoretical coupling efficiency of 50% or more is obtained by excluding the optical loss due to the material.

As described above, because optical parts are optically coupled by the self-alignment system, the tolerance for alignment in first securing the optical parts is large, no high accuracy is requested, and thus the coupling efficiency between the optical parts is improved.

The tolerance for alignment between the optical parts formed by the above way gets large.

Figure 20A:
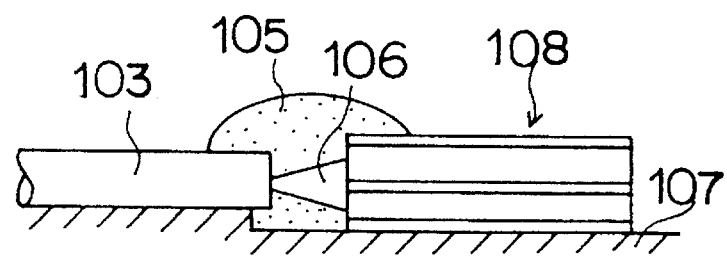
FIG. 20(a) is a sectional view showing the state of coupling the optical fiber with the semiconductor laser in the eighth embodiment of the present invention.

When optically coupling an optical fiber with a semiconductor layer, the optical fiber 103 and semiconductor laser 108 are mounted on the support substrate 107 to feed the refractive-index imaging material 105 between them as shown in FIG. 20(a). Thereafter, the refractive-index imaging material 105 is dried and the optical fiber 103 is bonded with the semiconductor laser 108 before introducing the light for forming a high refractive-index image from the optical fiber 103 to form the horn-shaped high refractive-index image 106 in the refractive-index imaging material 105. Thereby, the light emitted from the edge of the semiconductor laser 108 is absorbed by the high refractive-index image 106 and enters the core of the optical fiber 3.

(Ninth Embodiment)

For the eighth embodiment described above, the edges of two optical parts are faced each other and thereafter a refractive-index imaging material is fed to the gap between them and its periphery. However, it is also possible to previously feed the refractive-index imaging material onto a support substrate thickly, put two optical parts there, and couple their devices.

The embodiment is described below by referring to FIGS. 21(*a*) to 21(*d*).

First, as shown in FIG. 21(*a*), a refractive-index imaging material 105 dissolved in a solvent is dripped into a V-groove 102 on a support substrate 101. Then, as shown in FIG. 21(*b*), optical fibers 103 and 104 are mounted on the V-groove 102 so that the refractive-index imaging material 105 is held between the edges of the optical fibers 103 and 104.

Then, the refractive-index imaging material 105 is left as it is for several hours before applying the light for forming a high refractive-index image to the refractive-index imaging material 105 from at least the core of the optical fiber 103 to form the high reflective portion 106 described in the first embodiment.

Thereafter, the refractive-index imaging material is cured by applying light such as ultraviolet rays to or heating the material according to necessity, similarly to the case of the first embodiment.

The optical fibers 103 and 104 thus connected are bonded to the support substrate 101 by the refractive-index imaging material 105 similarly to the case of the first embodiment and emission of light is prevented by the high refractive-index image 106 formed in the material 105 to transmit light from the optical fiber 104 to the optical fiber 103.

(Tenth Embodiment)

For the eighth and ninth embodiment described above, a refractive-index imaging material is fed to the gap between the edges of two optical parts and its periphery to pass light through the material. However, the light emitted from a light-emitting device may be made to enter an optical fiber or light-detecting device through the space or light propagating in the space may be received by the light-detecting device.

The following is the description of optical coupling when sending or receiving light propagating in the space.

First, as shown in FIG. 22(*a*), a refractive-index imaging material 105 is applied to the optical input/output portion of a first optical fiber 103 and then dried to secure it to a support substrate 111.

Then, the light for changing refractive indexes is inputted to the refractive-index imaging material 105 from the optical fiber 103 to form a horn-shaped high refractive-index image 106B whose space side is widened according to a light intensity distribution as shown in FIG. 22(*b*). Thereafter, the refractive-index imaging material is cured by applying light such as ultraviolet rays to or heating the material according to necessity.

As shown in FIG. 22(*d*), it is also possible to form a high refractive-index image 106C whose central portion is the widest by applying light to the material 105 from both the optical fibers 103 and 104.

Then, as shown in FIG. 22(*c*), when the edge of the second optical fiber 104 is set toward a high refractive-index image 106B, the light emitted from the edge is collected by the high refractive-index image 106B and enters the core of the first optical fiber 103. In this case, it is not required to accurately position the second optical fiber 104.

Then, a case in optically coupling a semiconductor laser with an optical fiber through the space is described below by referring to FIG. 20(*b*).

When the optical fiber 103 is mounted on a support substrate 109 and the refractive-index imaging material 105 is fed to the edge of the fiber 103 and thereafter light is applied to the refractive-index imaging material 105 through the optical fiber 103, the horn-shaped high refractive-index image 106B whose space side is widened due to the light intensity distribution is formed in the refractive-index imaging material 105. When light is emitted toward the high refractive-index image 106 from a semiconductor laser 108, the light is focused by the high refractive-index image 106B and enters the optical fiber 103.

This is effective in transmitting light between optical parts secured separately from each other or making a space light beam enter a light-electricity transforming device.

For this embodiment, an optical part is mounted on a support substrate and thereafter a refractive-index imaging material is fed to at least the edge of the part. However, it is also possible to feed the refractive-index imaging material onto the support substrate and thereafter mounting the optical part on the support substrate.

(Eleventh Embodiment)

The above eighth to tenth embodiments use optical fibers as two optical parts to be connected. However, it is also possible to use the above coupling method when coupling same optical parts or different optical parts among optical fibers, waveguides, semiconductor lasers, semiconductor light amplifiers, waveguide-type photodiodes, and edge emitting devices.

To form a high refractive-index image in a refractive-index imaging material fed to the space between two optical parts and its periphery, for example, light is applied from one or both of the parts when coupling, for example, an optical fiber with a waveguide.

When coupling an optical fiber or waveguide with a photodiode, light is applied only from the optical fiber or waveguide to form a conical high refractive-index image. In this case, the light is not focused by the high refractive-index image. To propagate a divergent light, however, a propagative beam pattern whose divergence is prevented in self-focusing by the conical high refractive-index image is formed and the intensity of the light entering the light-detecting portion of the light-electricity transforming device can be increased.

Figure 20B:
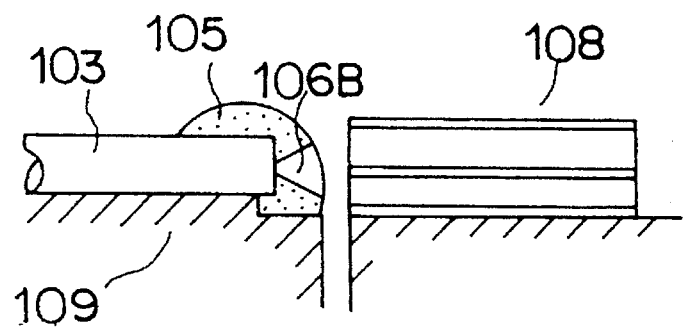
FIG. 20(b) is a sectional view showing the state of coupling the optical fiber with the semiconductor laser in the eighth embodiment of the present invention.
Figure 20C:
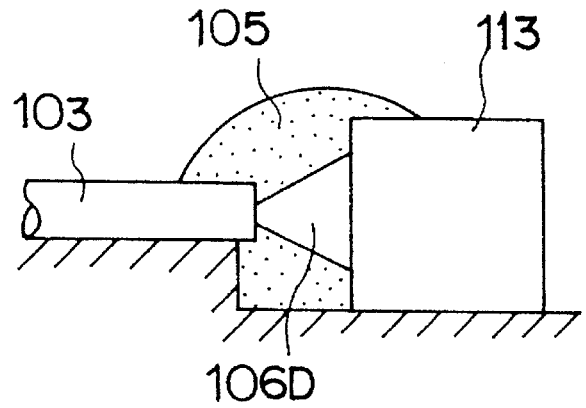
FIG. 20(c) is a sectional view showing the state of coupling the optical fiber with the photodiode in the eleventh embodiment of the present invention.
Figure 21A:
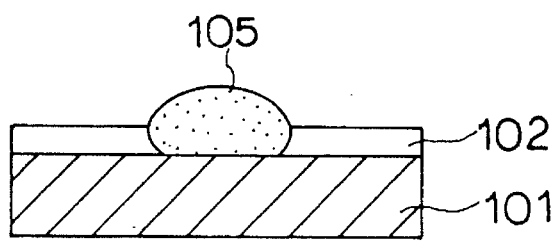
FIGS. 21(a) to 21(d) are sectional views showing the steps of the optical coupling method of the ninth embodiment of the present invention.
Figure 21B:
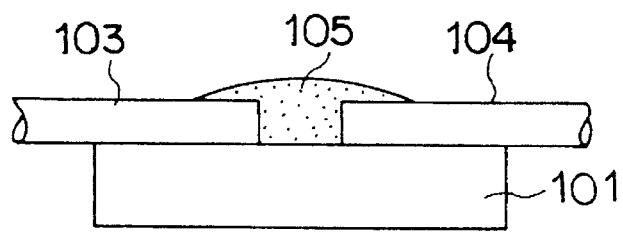
Figure 21C:
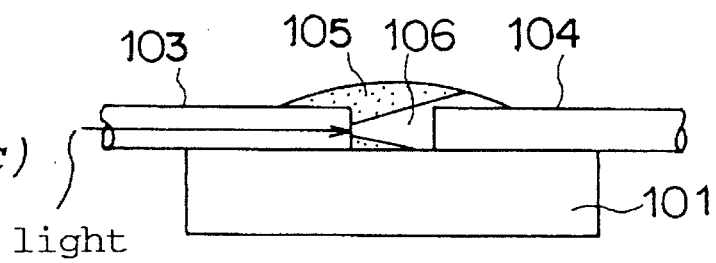
Figure 21D:
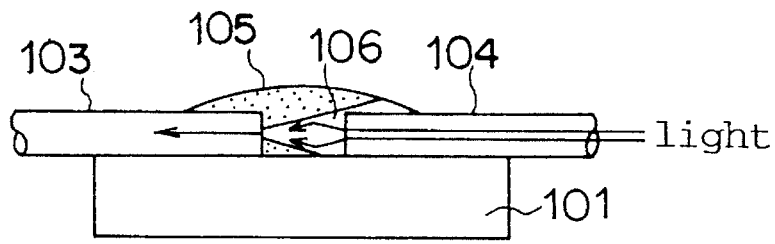
Figure 22A:
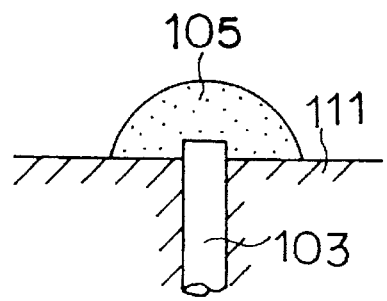
FIGS. 22(a) to 22(c) are sectional views showing the steps of the optical coupling method of the twelfth embodiment of the present invention and FIG. 22(d) is a sectional view showing another configuration of the optical coupling method of the twelfth embodiment of the present invention.
Figure 22B:
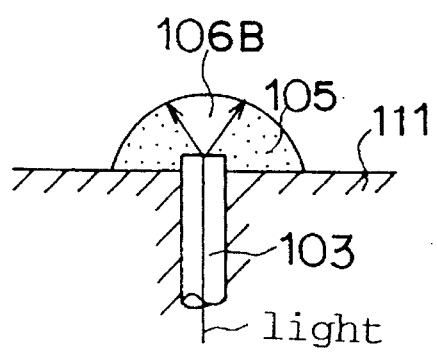
Figure 22C:
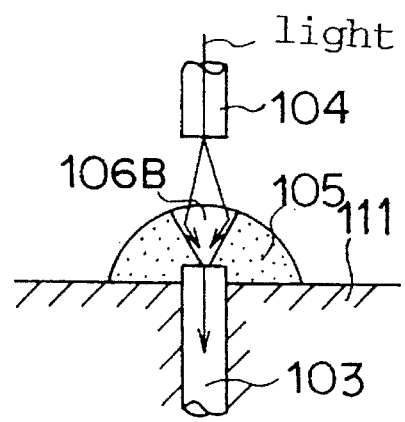
Figure 22D:
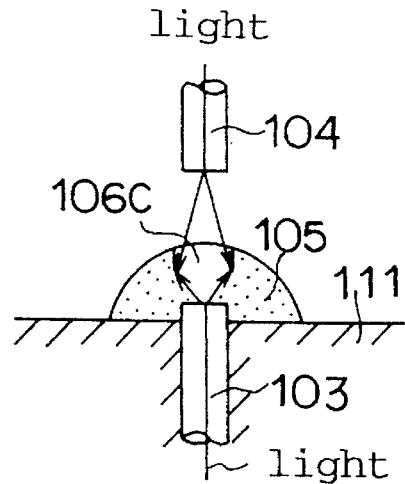

As shown in FIG. 20(*c*), for example, a photodiode 113 with the light-detecting face of 50 μm in diameter is secured, a gap of 1 mm is formed on the light-detecting face so that the edge of the optical fiber 103 faces the gap to feed the refractive-index imaging material 105 to the gap and its periphery while keeping the state. Then, the light with the wavelength of 488 nm is applied to the refractive-index imaging material 105 from the optical fiber 103 to form a high refractive-index image 106D. As a result, it is found that approx. 100% of the light is collected to the light-detecting face when providing the material with a refractive-index difference of up to 0.01. However, when no refractive-index distribution is formed in the above refractive-index imaging material, the light entering the light-detecting face of the photodiode is decreased to approx. 47%.

(Twelfth Embodiment)

For this embodiment, experiment results are described when a high refractive-index image is formed and not formed in a refractive-index imaging material.

Figure 23A:
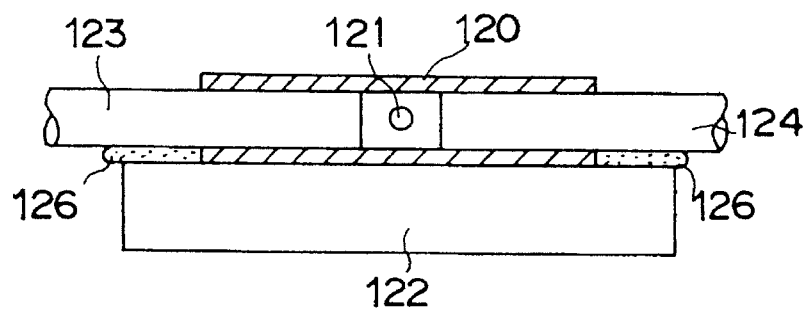
FIGS. 23(a) to 23(c) are sectional views showing the steps of the optical coupling methods of the thirteenth to seventeenth embodiments of the present invention and FIG. 23(d) is a sectional view showing another configuration of the optical coupling methods of the thirteenth to seventeenth embodiments of the present invention.
Figure 23B:
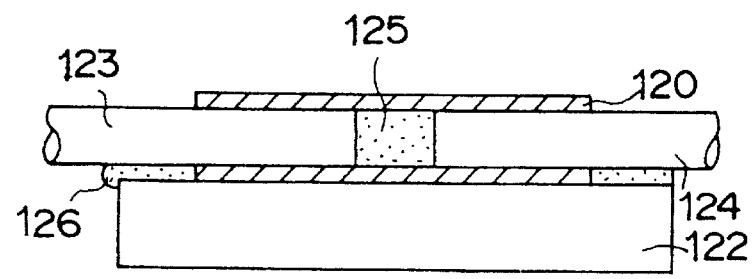

As shown in FIG. 23(a), a glass cylinder 120 having a transverse groove with the diameter of 145 μm is set to a support substrate 122 and thereafter first and second optical fibers 123 and 124 with the clad diameter of 125 μm and core diameter of 10 μm are inserted into the glass cylinder 120 from the both sides of the cylinder. In the glass cylinder 120, the edges of the optical fibers 123 and 124 are set to the both sides of the transverse groove 121 at the interval of 400 μm. Under this state, the optical fibers 123 and 124 are bonded to the support substrate 122 with an adhesive 127.

Then, the refractive-index imaging material 125 shown in Table 1 is dripped onto the transverse groove 121 of the glass cylinder 120 to fill the gap between the optical fibers 123 and 124, and this state is left as it is to dry the material.

[TABLE 1]

| MATERIAL | WEIGHT (g) |
| --- | --- |
| alicyclic epoxy (EHPE-3150, DAISEL UCB Co., Ltd.) | 1.5 |
| allylcarbazole (NIPPON JORYU KOGYO Co., Ltd.) | 0.4 |
| N-(β-acryloyloxyethy)carbazole (NIPPON JORYU KOGYO Co., Ltd.) | 0.1 |
| trimethylolpropane triacrylate (KYOEISHA YUSHI KAGAKUKOGYO Co., Ltd.) | 0.25 |
| multifunctional monomer (ART RESIN UN-100X, NEGAMI KOGYO Co., Ltd.) | 0.25 |
| bi-imidazole (B1225, TOKYO KASEI KOGYO Co., Ltd.) | 0.02 |
| methyl triazole tiol | 0.02 |
| cyclopentanone pigment (MKX1460, NIPPON KANKO SHIKISO Co., Ltd.) | 0.0004 |
| dichloromethane | 1.0 |
| tetrahydrofuran | 1.0 |

As the result of connecting the second optical fiber 124 to a not-illustrated light intensity measuring instrument and then applying a He-Ne laser beam with the wavelength of 632.8 nm to the first optical fiber 123 by using a laser focusing holder (not illustrated), the intensity of the light entering the light intensity measuring instrument through the second optical fiber 124 is 410 nW.

As the result of applying the He-Ne laser beam to the light intensity measuring instrument through a not-illustrated another optical fiber, the light intensity of 43 μW is obtained.

These measured values obtained from the light intensity measuring instrument are average values of the upper and lower limit values when performing measurement for approx. 1 min (the same is applied to the following description).

Then, the second optical fiber 124 is removed from the light intensity measuring instrument and an argon laser beam with the wavelength of 488 nm is applied to the refractive-index imaging material 125 through the optical fiber 124 for approx. 50 min by using the laser focusing holder. The intensity of the beam is set to 1,000 nW.

Figure 23C:
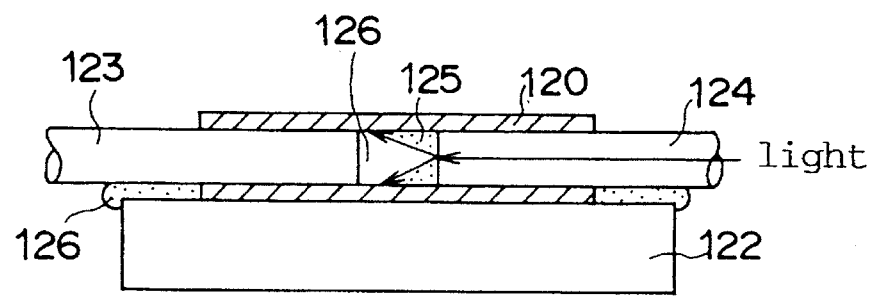
Figure 23D:
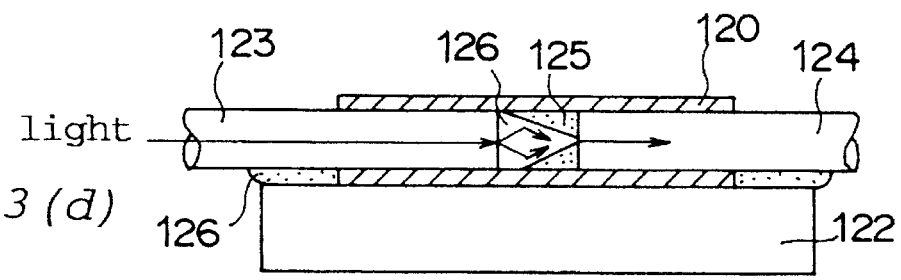

Thereby, as shown in FIG. 23(c), a high refractive-index image 126 is formed in the refractive-index imaging material 125.

Thereafter, as the result of connecting the second optical fiber 124 to the light intensity measuring instrument and introducing a laser beam with the wavelength of 632.8 nm into the second optical fiber 124 again through the first optical fiber 123, the light intensity measuring instrument shows the value of 6,780 nW.

Therefore, by applying the argon laser beam, it is confirmed that the high refractive-index image 126 is formed in the refractive-index imaging material 125.

Thereby, the intensity of the laser beam propagating from the first optical fiber 123 to the second optical fiber 124 increases up to approx. 16 times and the high refractive-index imaging material effect is confirmed. The optical coupling efficiency is calculated as approx. 16%.

The refractive-index imaging material shown in Table 1 is also applied to the eighth to eleventh embodiments. At a portion to which the argon laser beam is applied, monomers are polymerized, the monomer density increases according to the intensity distribution, and the refractive-index rises. The refractive-index imaging material also serves as an adhesive.

(Thirteenth Embodiment)

The first and second optical fibers 123 and 124 are secured in the glass cylinder 120 in the same way as the twelfth embodiment.

Then, the support substrate 122 supporting the glass cylinder 120 is mounted on a heating table (not illustrated) and the refractive-index imaging material 125 is fed into the gap between the edges of the optical fibers 123 and 124 to heat and dry the material at the temperature of 60° C. in the same way as the twelfth embodiment.

Then, as the result of connecting the second optical fiber 124 to the light intensity measuring instrument and introducing the He-Ne laser beam into the second optical fiber 124 through the first optical fiber 123 and refractive-index imaging material 125 by using the laser focusing holder, the light intensity measuring instrument shows the light intensity of 110 nW.

Thereafter, a laser beam with the wavelength of 488 nm is introduced into the second optical fiber 124 to apply it to the refractive-index imaging material 125 for 30 min.

Thereafter, the material is cooled at the temperature lowering rate of 0.5° C./min. Then, as the result of connecting the second optical fiber 124 to the light intensity measuring instrument and introducing the He-Ne laser beam into the first optical fiber 123 again and measuring the intensity of the light passing through the second optical fiber 124, the light intensity of 5520 nW is obtained.

Therefore, by heating and drying the refractive-index imaging material 125 and then applying the argon laser beam to the material, a high refractive-index image is formed. Thereby, the intensity of the laser beam entering the second optical fiber 124 from the firs optical fiber 123 increases up to approx. 50 times and the high refractive-index image effect is confirmed. The optical coupling efficiency is calculated as approx. 13%.

From the above mentioned, it is found that there is no bad influence even if heating is performed at approx. 60° C. before forming the high refractive-index image 126 in the refractive-index imaging material 125.

(Fourteenth Embodiment)

As the result of making the diameters of the clads and cores of the first and second optical fibers 123 and 124 described in the twelfth embodiment differ from each other and changing the refractive-index imaging material 125, the following results are obtained.

For example, the diameter of the clad of the first optical fiber 123 is set to 125 µm, the diameter of the core of it is set to 10 µm, and the diameter of the clad of the second optical fiber 124 is set to 125 µm and the diameter of the core of it is set to 50 µm.

[TABLE 2]

| MATERIAL | WEIGHT (g) |
| --- | --- |
| acrylic denatured silicone (KR9706, SHINETSU KAGAKU KOGYO Co., Ltd.) | 1.5 |
| allylcarbazole (NIPPON JORYU KOGYO Co., Ltd.) | 0.3 |
| vinylcarbazole (ANAN) | 0.1 |
| vinylnaphthalene (POLYSCIENCE) | 0.1 |
| multifunctional monomer (ART RESIN UN-100X, NEGAMI KOGYO Co., Ltd.) | 0.2 |
| 1,6-hexanediolmethacrylate (KYOEISHA YUSHI KAGAKUKOGYO Co., Ltd.) | 0.2 |
| trimethylolpropane triacrylate (KYOEISHA YUSHI KAGAKUKOGYO Co., Ltd.) | 0.2 |
| bi-imidazole (B1225, TOKYO KASEI KOGYO Co., Ltd.) | 0.02 |
| methyl triazole tiol | 0.02 |
| cyclopentanone pigment (MKX1460, NIPPON KANKO SHIKISO Co., Ltd.) | 0.0004 |
| dichloromethane | 1.0 |
| tetrahydrofuran | 1.0 |

Thereafter, as the result of connecting the optical fiber 123 to the light intensity measuring instrument and introducing a beam with the wavelength of 632.8 nm into the second optical fiber 124, the light intensity measuring instrument indicates the light intensity of 55 nW.

Then, the first optical fiber 123 is removed from the light intensity measuring instrument and ultraviolet rays are introduced into the first optical fiber 123 to apply the rays to the refractive-index imaging material 125 present between the optical fibers 123 and 124 for 30 min.

Thereafter, as the result of connecting the second optical fiber 124 to the light intensity measuring instrument again and introducing a beam with the wavelength of 632.8 nm through the first optical fiber 123 and high refractive-index image 126, the light intensity measuring instrument indicates the light intensity of 1,730 nW. Thus, the intensity of the light propagating in the optical fibers 123 and 124 increases up to approx. 31 times.

The refractive-index imaging material shown in Table 2 is applied to the eighth to eleventh embodiments. At a portion to which the argon laser beam is applied, monomers are polymerized, the monomer density increases according to the beam intensity distribution, and the refractive index rises. The refractive-index imaging material also serves as an adhesive.

(Fifteenth Embodiment)

The refractive-index imaging material of this embodiment is compounded as follows:

First, 1.6 g of acrylic denatured silicone varnish KR9706, 0.8 g of methylmethacrylate, 0.3 g of glycidyl methacrylate, and 0.04 g of azobis(isobutyronitrile) are dissolved in dioxane of 7.2 g and they are heated and agitated at 70° C. for 1 hr. Then, they are cooled up to the room temperature and thereafter, 40 µl (microlitter) of trimethylolpropane triacrylate and 40 µl of neopentyl glycol diacrylate are dripped into them and they are agitated and then moreover heated and agitated at 70° C. for 1 hr.

Then, they are cooled up to the room temperature. Thereafter, 1.0 g of tetrahydrofuran, 0.66 g of allyl carbazole, 0.66 g of N-vinyl carbazole, 0.66 g of trimethylolpropane triacrylate, 0.04 g of bi-imidazole (B1225, TOKYO KASEI Co., Ltd.), 0.04 g of methyl triazole thiol, and 0.04 g of cyclopentanone pigment (NKX1460, NIPPON KANKO SHIKISO Co., Ltd.) are added to them.

This completes compounding of the refractive-index imaging material.

Thereafter, the first and second optical fibers 123 and 124 same as those used for the twelfth embodiment are inserted into the glass cylinder 120.

Then, as the result of connecting the first optical fiber 123 to a light intensity measuring instrument (not illustrated) and introducing a beam with the wavelength of 632.8 nm into the second optical fiber 124 without filling the gap between the optical fibers 123 and 124 with any material, the light intensity measuring instrument indicates the light intensity of 8 µW.

As the result of inputting a beam with the wavelength of 632.8 nm to the light intensity measuring instrument through another optical fiber, the instrument indicates the light intensity of 60 µW.

Then, the above refractive-index imaging material 125 is dripped into the transverse groove 121 of the glass cylinder 120 to fill the gap between the optical fibers 123 and 124 with the material, and this state is left as it is for 14 hr to dry the material.

Then, as the result of connecting the first optical fiber 123 to the light intensity measuring instrument and introducing a beam with the wavelength of 632.8 nm into the second optical fiber, the instrument indicates the light intensity of 9 µW.

Then, an argon laser beam is applied to the refractive-index imaging material 125 for 80 min through the second optical fiber 124. Thereby, the high refractive-index image 126 is formed.

Thereafter, as the result of applying a beam with the wavelength of 488 nm to the light intensity measuring instrument by using another optical fiber, the instrument indicates the light intensity of 40 nW. As the result of connecting the first optical fiber 123 to the light intensity measuring instrument and introducing a beam with the wavelength of 632.8 nm into the second optical fiber 124, the instrument indicates the light intensity of 30 µW. The coupling efficiency is calculated as 50%.

(Sixteenth Embodiment)

The refractive-index imaging material of this embodiment is compounded as follows:

First, 1.6 g of acrylic denatured silicone varnish KR9706 0.8 g of methylmethacrylate, 0.4 g of glycidyl methacrylate, and 0.04 g of azobis(isobutyronitrile) are dissolved in dioxane of 7.2 g and they are heated and agitated at 70° C. for 2 hr.

Then, they are cooled up to the room temperature and thereafter, 0.66 g of allyl carbazole, 0.66 g of N-vinyl carbazole, 0.66 g of trimethylolpropane triacrylate, 0.04 g of bi-imidazole, 0.04 g of methyl triazole thiol, and 0.0004 g of cyclopentanone pigment are added to them and agitated. This completes compounding of the refractive-index imaging material.

An experiment is performed by using the above material and a beam with the wavelength of 1.3 μm instead of the beam with the wavelength of 632.8 nm used for the fifteenth embodiment.

First, the optical fibers 123 and 124 same as those used for the fifteenth embodiment are inserted into the glass cylinder 120.

Then, the refractive-index imaging material 125 shown in the fifteenth embodiment is dripped into the transverse groove of the glass cylinder to fill the gap between the optical fibers 123 and 124 with the material, and this state is left as it is for 17 hr to dry the material.

Then, as the result of connecting the first optical fiber 123 to a light intensity measuring instrument (not illustrated) and introducing a beam with the wavelength of 1.3 μm into the second optical fiber 124, the instrument indicates the light intensity of 50 μW.

As the result of inputting a beam with the same wavelength to the light intensity measuring instrument through another optical fiber (not illustrated), the instrument indicates the light intensity of 180 μW.

Then, an argon laser beam is applied to the refractive-index imaging material 125 through the second optical fiber 124 to form the high refractive-index image 126.

Thereafter, as the result of connecting the first optical fiber 123 to the light intensity measuring instrument and introducing the beam with the wavelength of 1.3 μm into the second optical fiber 124 again, the instrument indicates the light intensity of 170 μW.

When the refractive-index imaging material 125 is left as it is, unreacted monomers in the material are polymerized with elapse of time and the light intensity decreases. Therefore, the stability of the material becomes degraded.

Therefore, the high refractive-index image 126 is formed to measure the light intensity and thereafter ultraviolet rays are applied to the material for 160 min from the outside. When 10 min passes after start of application of ultraviolet rays, the entire portion is heated at 40° C.

Thereafter, as the result of measuring the intensity of the light passing through the first optical fiber 123, high refractive-index image 126, and second optical fiber 124, the light intensity of approx. 100 μW is obtained.

As the result of leaving this state as it is for 17 hr and measuring the light intensity again, it is found that the value hardly changes, the light intensity is not decreased due to applying of ultraviolet rays or heating, and the material is stable.

(Seventeenth Embodiment)

The refractive-index imaging material of this embodiment is compounded as follows:

First, 0.1 g of silicon contained monomer (V4800, CHISSO Co., Ltd.), 0.35 g of methyl methacrylate, 0.35 g of trifluoromethyl methacrylate, 0.1 g of glycidyl methacrylate, and 0.02 g of azobisisobutyronitrile are dissolved in dioxane of 4.0 g and they are heated and agitated at 70° C. for 1 hr.

Then, they are cooled up to the room temperature and thereafter, 40 μl (microlitter) of trimethylolpropane triacrylate and 40 μl of neopentyl glycol diacrylate are dripped into them and they are agitated and then moreover heated and agitated at 70° C. for 6 hr.

Then, they are cooled up to the room temperature. Thereafter, 1.0 g of tetrahydrofuran, 0.25 g of allyl carbazole, 0.25 g of N-vinyl carbazole, 0.25 g of methacryloxyethyl oxycarbazole, 0.25 g of trimethylolpropane triacrylate, 0.04 g of bi-imidazole (B1225, TOKYO KASEI Co., Ltd.), 0.04 g of methyl triazole thiol, and 0.04 g of cyclopentanone pigment (NKX1460, NIPPON KANKO SHIKISO Co., Ltd.) are added to them.

This completes compounding of the refractive-index imaging material.

Figure 24A:
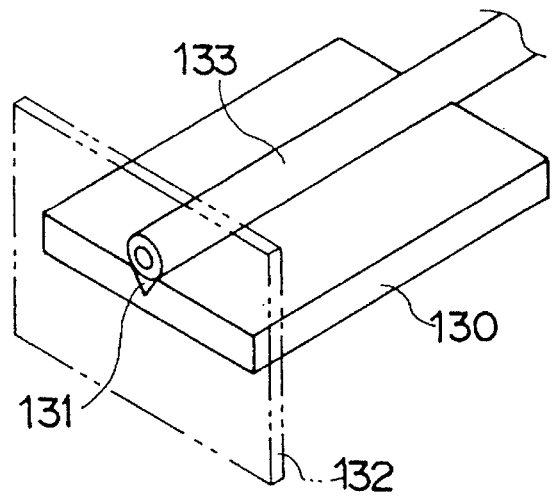
FIG. 24(a) is a perspective view showing the initial state of the optical coupling method of the eighteenth embodiment of the present invention and FIGS. 24(b) to 24(c) are sectional views showing the steps of the optical coupling method of the eighteenth embodiment of the present invention.

Then, as shown in FIG. 24(a), one face of a second glass plate 132 with the thickness of 0.2 mm is bonded to one edge of a first glass plate 130 with the dimensions of 30×30×5 mm having a V-groove 131 with the maximum width of 300 μm.

Then, the other end of an optical fiber 133 with one end connected to a connector and its periphery are stripped and fitted into the V-groove 131 of the first glass plate 130 and secured so that the other end is separate 1 mm from the second glass plate 132.

Figure 24B:
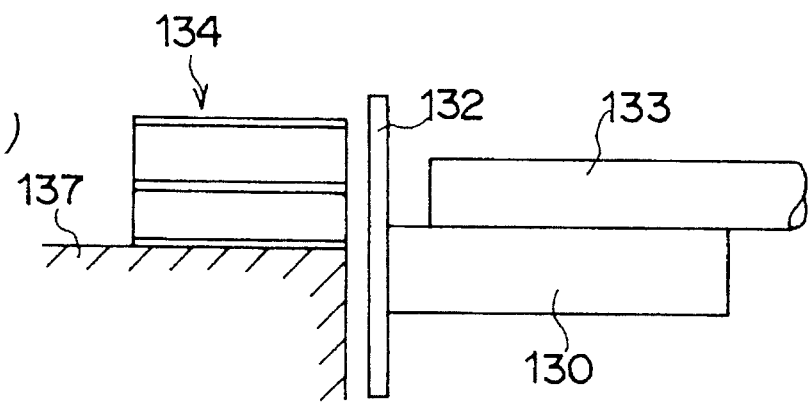

Then, as shown in FIG. 24(b), a semiconductor laser 134 is mounted on a slow-motion stage 137 so that the light output portion of the laser 134 faces the edge of the optical fiber 133 through the second glass plate 132. Moreover, the connector at one end of the optical fiber 133 is connected to a light intensity measuring instrument (not illustrated).

As the result of applying the current of 40 mA to the laser 134 to emit light, the light intensity measuring instrument indicates the light intensity of 15 nW.

Figure 24C:
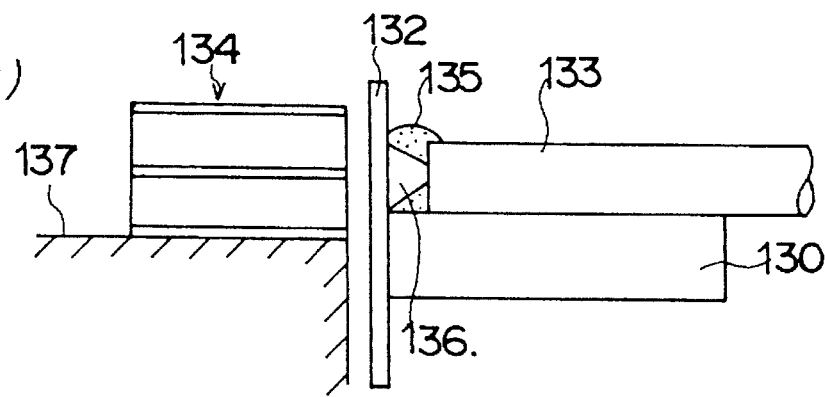

Then, as shown in FIG. 24(c), the refractive-index imaging material 135 is dripped into the gap between the edge of the optical fiber 133 and second glass plate 132 to dry the material. Then, an argon laser beam with the wavelength of 515 nm is applied to the refractive-index imaging material 135 for 150 min through the optical fiber 133. Thereby, a horn-shaped high refractive-index image 136 is formed.

Thereafter, as the result of making the semiconductor laser 134 emit light again, the light intensity indicated by the light intensity measuring instrument increases up to 190 nW.

The refractive-index imaging material of this embodiment is applied to the eighth to ninth embodiments. At a portion to which the argon laser beam is applied, monomers are polymerized, the monomer density increases according to the intensity distribution, and the refractive index rises. The refractive-index imaging material also serves as an adhesive.

(Eighteenth Embodiment)

In the above refractive-index imaging material, it is possible to form not only the above-mentioned refractive-index image having the focusing lens effect but an interference-fringe image formed through interference exposure with coherent light as a refractive-index image. The following is the description of characteristics when forming a refractive-index image from an interference-fringe image and generating a hologram.

First, the refractive-index imaging material shown in Table 3 is applied to a glass substrate of 70×70 mm with a doctor blade and dried in a nitrogen box for 1 hr and then in an oven at 70° C. for 10 min to use it as a sensitized plate.

[TABLE 3]

| MATERIAL | WEIGHT (g) |
| --- | --- |
| alicyclic epoxy (EHPE-3150, DAISEL UCB Co., Ltd.) | 1.0 |
| allylcarbazole (NIPPON JORYU KOGYO Co., Ltd.) | 0.2 |
| vinylcarbazole (ANAN) | 0.2 |
| multifunctional monomer (ART RESIN UN-100X, NEGAMI KOGYO Co., Ltd.) | 0.2 |
| trimethylolpropane triacrylate (KYOEISHA YUSHI KAGAKUKOGYO Co., Ltd.) | 0.2 |
| bi-imidazole (B1225, TOKYO KASEI KOGYO Co., Ltd.) | 0.04 |
| methyl triazole tiol | 0.04 |
| cyclopentanone pigment (MKX1460, NIPPON KANKO SHIKISO Co., Ltd.) | 0.0008 |
| dioxane | 2.0 |
| tetrahydrofuran | 2.0 |

A transmission-type hologram image with the spatial frequency of 2,500 interference-fringes/nm and the fringe inclination of 0° is exposed to the sensitized plate by using an argon laser beam with the wavelength of 488 nm. The exposure intensity is set to 2 mW/cm$^2$ and the exposure time is set to 200 sec. As the result of measuring the diffraction efficiencies ($\eta$s: diffraction efficiency in regenerating s-polarized light, $\eta$p: diffraction efficiency in regenerating p-polarized light), values of $\eta$s=55% and $\eta$p=80% are obtained.

Then, the transmission-type hologram is heated in an oven at 80° C. for 1 hr. As the result of measuring the diffraction efficiencies again, values of $\eta$s=19% and $\eta$p=74% are obtained. The film thickness of 23 µm is obtained. The film thickness is measured with a probe-type film thickness meter (ALPHASTEP TENCOL Inc.).

(Nineteenth Embodiment)

A hologram image is also described in this embodiment.

First, the refractive-index imaging material shown in Table 4 is applied to a glass substrate of 70×70 mm with a doctor blade and dried in a nitrogen box for 1 hr and then in an oven at 70° C. for 10 min to use it as a sensitized plate.

[TABLE 4]

| MATERIAL | WEIGHT (g) |
| --- | --- |
| chlorotrifluoroethylene/vinyl trimethyl acetate/hydroxyethlacrylate = 31/51/18 mol ratio polymerization | 1.0 |
| allylcarbazole (NIPPON JORYU KOGYO Co., Ltd.) | 0.2 |
| vinylcarbazole (ANAN) | 0.2 |
| naphtylacrylate (POLYSCIENCE) | 0.2 |
| multifunctional monomer (ART RESIN UN-100X, NEGAMI KOGYO Co., Ltd.) | 0.2 |
| trimethylolpropane triacrylate (KYOEISHA YUSHI KAGAKUKOGYO Co., Ltd.) | 0.2 |
| bi-imidazole (B1225, TOKYO KASEI KOGYO Co., Ltd.) | 0.04 |
| methyl triazole tiol | 0.04 |
| cyclopentanone pigment (MKX1460, NIPPON KANKO SHIKISO Co., Ltd.) | 0.0008 |
| dioxane | 2.0 |
| tetrahydrofuran | 2.0 |

A mirror-reflection-type hologram image with the incident angle of 45° is exposed to the sensitized plate by using an argon laser beam with the wavelength of 488 nm. The exposure intensity is set to 1 mW/cm$^2$ and the exposure time is set to 400 sec. After exposure of the image, transmission spectrum is measured through vertical incidence by using an instantaneous spectrophotometer (MCPD-100, OTSUKA DENSHI Co., Ltd.). As a result, a spectrum having a small-transmittance region due to diffraction around the wavelength of 540 nm is obtained. The diffraction efficiency is 48% and the diffraction wavelength width is 9 nm.

Then, the reflection-type hologram is heated in an oven at 80° C. for 1 hr. Then, as the result of measuring the transmission spectrum and calculating the diffraction efficiency and diffraction wavelength width is measured in the same way as the twelfth embodiment, the diffraction efficiency is 69%, the diffraction wavelength width is 28 nm, and the film thickness is 26 µm.

(Twentieth Embodiment)

A hologram image is also described in this embodiment.

First, the refractive-index imaging material shown in Table 4 is applied to a glass substrate of 70×70 mm with a doctor blade and dried in a nitrogen box for 1 hr and then in an oven at 70° C. for 10 min to use it as a sensitized plate.

[TABLE 5]

| MATERIAL | WEIGHT (g) |
| --- | --- |
| acrylic denatured silicone (KR9706, SHINETSU KAGAKU KOGYO Co., Ltd.) | 1.0 |
| allylcarbazole (NIPPON JORYU KOGYO Co., Ltd.) | 0.2 |
| vinylcarbazole (ANAN) | 0.2 |
| ALONIX M315 (TOAGOSEI KAGAKUKOGYO Co., Ltd.) | 0.2 |
| trimethylolpropane triacrylate (KYOEISHA YUSHI KAGAKUKOGYO Co., Ltd.) | 0.2 |
| bi-imidazole (B1225, TOKYO KASEI KOGYO Co., Ltd.) | 0.04 |
| methyl triazole tiol | 0.04 |
| cyclopentanone pigment (MKX1460, NIPPON KANKO SHIKISO Co., Ltd.) | 0.0008 |
| dioxane | 1.5 |
| tetrahydrofuran | 1.5 |

A transmission-type hologram is exposed to the sensitized plate in the same way as the eleventh embodiment. As the result of measuring the diffraction efficiencies, values of $\eta$s=75% and $\eta$p=49% are obtained.

Then, the transmission-type hologram is heated in an oven at 80° C. for 1 hr. As the result of measuring the diffraction efficiencies, values of $\eta$s=82% and $\eta$p=87% are obtained. The film thickness is 31 µm.

Moreover, as the result of using epoxy denatured silicone (SR2115, TORAY DOW CORNING Co., Ltd.) shown in Table 5 instead of acrylic denatured silicone, compounding a solution by adding 0.05 g of a hardener (SR2115K, TORAY DOW CORNING Co., Ltd.), and similarly making a hologram, diffraction efficiencies of $\eta$s=78% and $\eta$p=70% are obtained.

(Twenty-First Embodiment)

A hologram image is also described in this embodiment.

First, a sensitized plate is made by similarly applying the refractive-index imaging material used for the twentieth embodiment.

A reflection-type hologram is exposed to the sensitized plate by using an argon laser beam with the wavelength of 488 nm and reflection-type hologram making optical system with the incident angle of 30°–60°.

Then, as the result of measuring the transmission spectrum and examining characteristics in the same way as the eighteenth embodiment, the diffraction efficiency is 32% and the diffraction wavelength width is approx. 9 nm.

Then, the reflection-type hologram is heated in an oven at 80° C. for 1 hr. As the result of measuring the spectrum and examining characteristics again, the diffraction efficiency is 42% and the diffraction wavelength width is approx. 14 nm.

(Twenty-Second Embodiment)

A hologram image is also described in this embodiment.

First, the refractive-index imaging material compounded in the fourteenth embodiment is applied to a glass substrate of 70×70 mm with a doctor blade and dried in a nitrogen box for 1 hr and then in an oven at 70° C. for 10 min.

A reflection-type hologram is exposed to the sensitized plate by using an argon laser beam with the wavelength of 488 nm and a reflection-type hologram making optical system with the incident angle of 30°–60°.

As the result of measuring the transmission spectrum and examining characteristics in the same way as the eleventh embodiment, the diffraction efficiency is 41% and the diffraction wavelength width is approx. 9 nm.

(Twenty-Third Embodiment)

The following is the description of refractive-index imaging materials.

<1> Refractive-index imaging materials are made of, for example, the following materials.

The first refractive-index imaging material is made of an alicyclic or chain compound having an epoxy group, ethylene unsaturated compound containing an aromatic ring or halogen, multifunctional acrylate or multifunctional methacrylate, and photopolymerization initiator.

The second refractive-index imaging material is made of an organic denatured silicone, ethylene unsaturated compound containing an aromatic ring or halogen, multifunctional acrylate or multifunctional methacrylate, and photopolymerization initiator. The organic denatured silicone is any one of acrylic denatured silicone, methacrylic denatured silicone, and epoxy denatured silicone.

The third refractive-index imaging material is compounded by the following method.

First, an ethylene unsaturated compound containing silicone, an ethylene unsaturated compound whose general expression is shown as "$R_1CH=CHCOOR_2$", and thermopolymerization initiator are dissolved in a solvent and heated and agitated to make a copolymer solution. Then, the copolymer solution is cooled up to the room temperature and thereafter, an ethylene unsaturated compound containing an aromatic ring or halogen, multifunctional acrylate or multifunctional methacrylate, and photopolymerization initiator are added to the copolymer solution. Thus, the refractive-index imaging material is completed. In this case, $R_1$ in the general expression is $CH_3$ or H and $R_2$ is a chain compound or alicyclic compound group having carbon atoms of 1 to 4 (the same is applied to the following).

The fourth refractive-index imaging material is compounded by the following method.

First, an ethylene unsaturated compound containing silicone, an ethylene unsaturated compound whose general expression is shown as "$R_1CH=CHCOOR_2$", multifunctional acrylate or multifunctional methacrylate, and thermopolymerization initiator are dissolved in a solvent and heated and agitated to make a copolymer solution. Then, the copolymer solution is cooled up to the room temperature and thereafter, an ethylene unsaturated compound containing an aromatic ring or halogen, multifunctional acrylate or multifunctional methacrylate, and photopolymerization initiator are added to the copolymer solution. Thus, the refractive-index imaging material is completed.

The fifth refractive-index imaging material is made of a thermosetting copolymer containing acrylate or methacrylate having a hydrogen group at its end in the building block of the copolymer, an ethylene unsaturated compound containing an aromatic ring or halogen, multifunctional acrylate or multifunctional methacrylate, and photopolymerization initiator. The thermosetting copolymer is a substance containing, for example, chlorotrifluoroethylene, vinyl trimethyl acetate, and acrylate or methacrylate having a hydroxyl group at its end in the building block of the substance.

In the above refractive-index imaging material s, the ethylene unsaturated compound containing an aromatic ring or halogen is any one of, for example, allyl carbazole, methacryloyloxyethylcarbazole, acryloylethyloxycarbazole, vinylcarbazole, vinylnaphthalene, naphtylacrylate, tribromophenylacrylate, dibromophenylacrylate, and phenoxyethylacrylate, or a mixture of any ones of these compounds.

<2> The following are components of a refractive-index imaging material.

The refractive-index imaging material is made of at least a binder, photosensitive monomer, and optical initiator.

(i) The binder of the refractive-index imaging material uses a copolymer having alicyclic epoxy, chain epoxy, organic denatured silicone, and ethylene unsaturated compound containing a hydroxyl group at its end in the building block of the copolymer or a copolymer having an ethylene unsaturated compound containing silicone in the building block of the copolymer. These binders have a reactive group, which can be made to react through heating or optical reflection. Thus, a high durability can be obtained.

It is possible to use 3,4-epoxycyclohexylmethyl-3,4-epoxycyclohexanecarboxylate, ERL-4299 (made by UCC), ERL-4092 (made by UCC), EHPE-3150 (DAISERU UCB Co., Ltd.), EPOLAITO 4000, EPOLAITO 100MF, EPOLAITO 80MF, EPOLAITO 1600, EPOLAITO 1500NP, EPOLAITO 400P, EPOLAITO 400E, EPOLAITO M-1230 (KYOEISHA YUSHI KAGAKUKOGYO Co., Ltd.), and a mixture or copolymer of these compounds for the alicyclic or chain epoxy. EPOLAITO is a trade name.

It is possible to use acrylic denatured silicone, methacrylic denatured silicone, or epoxy denatured silicone for the organic denatured silicone. Moreover, it is possible to use a copolymer made by heating an ethylene unsaturated compound containing silicone and other ethylene unsaturated compounds in a solvent and partially copolymerizing them for the binder. It is also possible to add multifunctional acrylate or multifunctional methacrylate as a monomer to be copolymerized.

The ethylene unsaturated compound containing silicon includes 3-acryloxypropyltrimethoxy silane, 3-methacryloxylpropyltrimethoxy silane, methacryloxypropyltris (trimethylsiloxy) silane, acryloxypropylmethylbis (trimethylsiloxy) silane, acrylic denatured silicone, and methacrylic denatured silicone, and a mixture of these compounds.

The ethylene unsaturated compound includes methylmethacrylate, ethylmethacrylate, propylmethacrylate, isopropylmethacrylate, n-butylmethacrylate, isobutylmethacrylate, t-butylmethacrylate, ethylacrylate, and n-butylacrylate, and a mixture of these compounds.

(ii) The photosensitive monomer uses a mixture of multifunctional acrylate or methacrylate and ethylene unsaturated monomer containing an aromatic ring or halogen.

The ethylene unsaturated monomer containing an aromatic ring or halogen has a high refractive index. When light is applied to a portion of the monomer to polymerize the monomer at the portion and increase the density, the refractive index of the portion is improved compared with that of a portion to which no light is applied. The multifunctional acrylate or multifunctional methacrylate improves the durability by improving the photosensitivity and three-dimensionally cross-linking a polymer.

The ethylene unsaturated monomer containing an aromatic ring or halogen includes allylcarbazole, methacryloyloxyethylcarbazole, acryloylethyloxycarbazole, vinylcarbazole, vinylbenzylcarbazole, vinyloxyethylcarbazole, vinylnaphthalene, naphthylacrylate, tribromophenylacrylate, dibromophenylacrylate, phenoxyethylacrylate, 2,2'-(2-hydroxyethylmethacrylate) (2,3-hydroxyethylmethacrylate) dipheneto, 2,2'-(2-hydroxyethylmethacrylate) hydrogendiphenate, and a mixture of these compounds.

The multi functional acrylate or multi functional methacrylate includes trimethylolpropane triacrylate, neopentyl glycol diacrylate, pentaerythritol triacrylate, pentaerythritol tetracrylate, trimethylolpropane trimethacrylate, and a mixture of these compounds.

(iii) The photopolymerization initiator includes organic peroxides such as 2,4,6-trimethylbenzoyldiphenylphosphine oxide, benzyl, benzoin isopropylether, BTTB (3,3',4,4'-tetra(t-butylperoxycarbonyl) benzophenone, benzoyl peroxide, di(t-butylperoxy) isophthalate; imidazole groups such as benzoimidazole and 2-(0-chlorophenyl)4,5-diphenylimidazole dimer; mixtures made by combining compounds such as 2-mercaptobenzothiazole, P-diethylaminobenzophenone, 1H-1,2,4-triazole-3-thiol, and 4-methyl-4H-1,2,4-triazole-3-thiol, and iron-allene complex such as pyrene-cyclopentadienyl-iron-hexafluoroantimonate. Moreover, the sensitizing pigment includes 4-(dicyanomethylene)-2-methyl-6-(P-dimethylaminostyryl)-4H-pyrane, 3,3'-carbonylbis(7-diethylaminocoumarin), 2,5-bis(4-diethylaminobenzylidene) cyclopentanone, and 2,6-bis(4-dimethylaminobenzylidene) cyclohexane.

(iv) It is possible to use a thermosetting agent so as to thermoset a thermoset non-photosensitive component.

For example, the thermoserring agent when using a binder containing an epoxy group includes amino acids such as hexamethylenediamine, trimethylhexamethylenediamine, diethylenetriamine, triethylenetetramine, tri(methylamino)hexane, diethylaminopropylamine, menthenediamine, and isophoronediamine; acid hydrides such as methyltetrahydro acid phthalic anhydride and methylhexahydro acid phthalic anhydride; and imidazole groups such as 2-ethyl-4-methylimidazole and 2-phenylimidazole. The thermoserring agent when using a binder having a hydroxyl group includes isocyanate-based thermosetting agents such as COLONEITO EH (trade name) (NIPPON POLYURETHANE Co., Ltd.), COLONEITO 2092 (trade name) (NIPPON POLYURETHANE Co., Ltd.), DULANEITO THA-100 (trade name) (ASAHI CHEMICAL INDUSTRY CO., LTD.), DULANEITO TPA-100 (trade name) (ASAHI CHEMICAL INDUSTRY CO., LTD.), SUMIDALU N3500 (trade name) (SUMITOMO BEYER URETHANE, LTD.), and TAKENEITO D-170N (trade name) (Takeda Chemical Industries, Ltd.) and melamine-based thermosetting agents such as NIKALAKU MW030 (trade name) (SANWA CHEMICAL Co., Ltd. ), NIKALAKU MX-40 (trade name) (SANWA CHEMICAL Co., Ltd. ), and SAIMELU 325 (trade name) (Mitsui Toatsu Chemicals, Inc.).

(v) Materials of the above binders and photosensitive monomers are dissolved in a solvent to be compounded as a solution according to necessity. For the solvent, a solvent for dissolving a material to be used is selected among tetrahydrofuran, tetrahydropyrane, acetone, methanol, diacetone alcohol, dichloromethane, dichloroethane, ethyl acetate, butyl acetate, dioxane, and toluene.

The compounded solution is fed or set through a method such as injection, dripping, spin coating, knife coating, dipping, or screen printing. When a solution contains a solvent, the solvent is removed through a method such as leaving, heating, or decompressing.

A refractive-index distribution is formed by applying light to a material. A light applying method such as one-light-flux exposure, multiple-light-flux exposure, or interference exposure is used according to the formed refractive-index distribution. A light source is selected among ultraviolet rays, visible rays, and infrared rays according to the photosensitive wave range of a photopolymerization initiator or sensitizer added to a material. The interference exposure uses a coherent light source.

To form a refractive-index distribution, it is possible to heat a material at 40° to 140° C. in addition to the above light applying step and moreover apply light to the entire material. With these steps, it is possible to make unreacted monomers reactive to cure them and destroy unreacted photopolymerization initiator or sensitizer.

As described above, the refractive-index imaging material of the present invention can be cross-linked or polymerized by heating the material or applying light to it and therefore a high durability can be obtained because it uses a compound with reactive groups such as a copolymer having alicyclic or chain epoxy, acrylic denatured silicone, methacrylic denatured silicone, epoxy denatured silicone, and ethylene unsaturated compound including a hydroxyl group at its end in the building block of the copolymer.

(Twenty-Fourth Embodiment)

The refractive-index imaging material of each embodiment described above is dissolved in a solvent and thereafter the solution is fed to optical parts by the injection method, dripping method, spin coating method, or other method.

Moreover, light with a wavelength for forming a high refractive-index image is applied to a part of the refractive-index imaging material fed by one of the methods after the solvent is removed from the material.

And, before or after the high refractive-index image is formed, at least either of heating at 40° to 140° C. and application of ultraviolet rays is performed.

What is claimed is:

1. A method of coupling optical parts comprising the steps of:

relatively movably retaining first and second optical parts;

facing optical coupling faces of waveguides of the first and second optical parts with each other and at least partially aligning a part of one optical coupling face with a part of the other optical coupling face; and fusing the optical coupling faces of the first and second optical parts and bonding them to each other, wherein the optical coupling face of at least one of the first and second optical parts and the non-coupling face around the optical coupling face are different in hydrophilic and hydrophobic properties.

2. A method of coupling optical parts comprising the steps of:

fixing edges of two optical parts separately from each other;

feeding a refractive-index imaging material having a function serving as an adhesive and forming a refractive-index distribution according to the intensity of light in a specified wave range to the gap between the edges of the two optical parts; and forming a refractive-index distribution with a focusing lens effect by applying the light in the specified wave range to the refractive-index imaging material from the edge of at least one of the two optical parts.

3. A method of coupling optical parts according to claim 2, wherein the optical parts includes any one of an optical fiber, semiconductor laser, light-emitting diode, photodiode, and semiconductor light amplifier.

4. A method of coupling optical parts according to claim 2, wherein a step of curing the refractive-index imaging material by applying light to or heating the material is included.

5. A method of coupling optical parts according to claim 2, wherein the interval between the optical parts to be coupled is set to 0.1 mm or more.

6. The method of coupling optical parts according to claim 2, wherein the refractive-index imaging material comprises:

a binder consisting of one of a copolymer having alicyclic epoxy, chain epoxy, organic denatured silicone, and ethylene unsaturated compound having a hydroxyl group in one end in the building block of the copolymer and a copolymer having any one of ethylene unsaturated compounds containing silicone in the building block of the copolymer;

a photosensitive monomer made of a mixture including multifunctional acrylate or multifunctional methacrylate and an ethylene unsaturated monomer containing an aromatic ring or halogen; and a photopolymerization initiator.

7. The method of coupling optical parts according to claim 2, wherein the refractive-index imaging material comprises an alicyclic or chain compound having an epoxy group, an ethylene unsaturated compound containing an aromatic ring or halogen, multifunctional acrylate or multifunctional methacrylate, and photopolymerization initiator.

8. The method of coupling optical parts according to claim 2, wherein the refractive-index imaging material comprises organic denatured silicone, an ethylene unsaturated compound containing any one of an aromatic ring or halogen, multifunctional acrylate or multifunctional methacrylate, and a photopolymerization initiator.

9. The method of coupling optical parts according to claim 2, wherein the refractive-index imaging material comprises:

a copolymer solution obtained by dissolving an ethylene unsaturated compound whose general expression is shown as "$R_1CH=CHCOOR_2$" in which $R_1$ is any one of $CH_3$ and H and $R_2$ is a chain or alicyclic compound group with carbon atoms of 1 to 4, an ethylene unsaturated compound containing silicone, and thermopolymerization initiator in an solvent and heating and agitating the dissolved substances;

an ethylene unsaturated compound containing an aromatic ring or halogen to be added into the copolymer solution cooled up to the room temperature;

multifunctional acrylate or multifunctional methacrylate to be added to the copolymer solution cooled up to the room temperature; and a photopolymerization initiator to be added to the copolymer solution cooled up to the room temperature.

10. The method of coupling optical parts according to claim 2, wherein the refractive-index imaging material comprises:

a copolymer solution obtained by dissolving an ethylene unsaturated compound whose general expression is shown as "$R_1CH=CHCOOR_2$" in which $R_1$ is any one of $CH_3$ and H and $R_2$ is a chain or alicyclic compound group with carbon atoms of 1 to 4, an ethylene unsaturated compound containing silicone, any one of multifunctional acrylate and multifunctional methacrylate, and thermopolymerization initiator in an solvent and heating and agitating the dissolved substances;

an ethylene unsaturated compound containing an aromatic ring or halogen to be added into the copolymer solution cooled up to the room temperature;

multifunctional acrylate or multifunctional methacrylate to be added to the copolymer solution cooled up to the room temperature; and a photopolymerization initiator to be added to the copolymer solution cooled down to room temperature.

11. The method of coupling optical parts according to claim 2, wherein the refractive-index imaging material for forming a refractive-index distribution by applying light in a specified wave range comprises a thermosetting copolymer containing acrylate or methacrylate having a hydroxyl group at its end in the building block of the copolymer, an ethylene unsaturated compound containing an aromatic ring or halogen, multifunctional acrylate or multifunctional methacrylate, and a photopolymerization initiator.

12. A method of coupling optical parts comprising the steps of:

feeding a refractive-index imaging material which has a function serving as an adhesive for optical parts and whose refractive-index increases according to the intensity of light in a specified wave range onto a support;

mounting two optical parts on the support by facing the edges of the two optical parts each other through the refractive-index imaging material; and forming a refractive-index distribution having a focusing lens effect by applying light in the specified wave range to the refractive-index imaging material from the edge of at least one of the two optical parts.

13. The method of coupling optical parts according to claim 12, wherein the refractive-index imaging material comprises:

a binder consisting of one of a copolymer having alicyclic epoxy, chain epoxy, organic denatured silicone, and ethylene unsaturated compound having a hydroxyl group in its end in the building block of the copolymer and a copolymer having any one of ethylene unsaturated compounds containing silicone in the building block of the copolymer;

a photosensitive monomer made of a mixture including multifunctional acrylate or multifunctional methacrylate and an ethylene unsaturated monomer containing an aromatic ring or halogen; and a photopolymerization initiator.

14. A method of coupling optical parts according to claim 12, wherein the optical parts includes any one of an optical fiber, waveguide, semiconductor laser, light-emitting diode, photodiode, and semiconductor light amplifier.

15. A method of coupling optical parts according to claim 12, further comprising a step of curing the refractive-index imaging material by applying light to or heating the material.

16. A method of coupling optical parts according to claim 12, wherein the interval between the optical parts to be coupled is set to 0.1 mm or more.

17. The method of coupling optical parts according to claim 12, wherein the refractive-index imaging material comprises an alicyclic or chain compound having an epoxy group, an ethylene unsaturated compound containing an aromatic ring or halogen, multifunctional acrylate or multifunctional methacrylate, and photopolymerization initiator.

18. The method of coupling optical parts according to claim 12, wherein the refractive-index imaging material comprises organic denatured silicone, an ethylene unsaturated compound containing any one of an aromatic ring or halogen, multifunctional acrylate or multifunctional methacrylate, and a photopolymerization initiator.

19. The method of coupling optical parts according to claim 12, wherein the refractive-index imaging material comprises:

a copolymer solution obtained by dissolving an ethylene unsaturated compound whose general expression is shown as "$R_1CH=CHCOOR_2$" in which $R_1$ is any one of $CH_3$ and H and $R_2$ is a chain or alicyclic compound group with carbon atoms of 1 to 4, an ethylene unsaturated compound containing silicone, and thermopolymerization initiator in an solvent and heating and agitating the dissolved substances;

an ethylene unsaturated compound containing an aromatic ring or halogen to be added into the copolymer solution cooled up to the room temperature;

multifunctional acrylate or multifunctional methacrylate to be added to the copolymer solution cooled up to the room temperature; and a photopolymerization initiator to be added to the copolymer solution cooled up to the room temperature.

20. The method of coupling optical parts according to claim 12, wherein the refractive-index imaging material comprises:

a copolymer solution obtained by dissolving an ethylene unsaturated compound whose general expression is shown as "$R_1CH=CHCOOR_2$" in which $R_1$ is any one of $CH_3$ and H and $R_2$ is a chain or alicyclic compound group with carbon atoms of 1 to 4, an ethylene unsaturated compound containing silicone, any one of multifunctional acrylate and multifunctional methacrylate, and thermopolymerization initiator in an solvent and heating and agitating the dissolved substances;

an ethylene unsaturated compound containing an aromatic ring or halogen to be added into the copolymer solution cooled up to the room temperature;

multifunctional acrylate or multifunctional methacrylate to be added to the copolymer solution cooled up to the room temperature; and a photopolymerization initiator to be added to the copolymer solution cooled up to the room temperature.

21. The method of coupling optical parts according to claim 12, wherein the refractive-index imaging material for forming a refractive-index distribution by applying light in a specified wave range comprises a thermosetting copolymer containing acrylate or methacrylate having a hydroxyl group at its end in the building block of the copolymer, an ethylene unsaturated compound containing an aromatic ring or halogen, multifunctional acrylate or multifunctional methacrylate, and a photopolymerization initiator.

22. A method of coupling optical parts comprising the steps of:

attaching a refractive-index imaging material which has a function serving as an adhesive for optical parts and whose refractive index increases according to the intensity of light in a specified wave range to the edge of a first optical part on a support; and forming a refractive-index distribution having a focusing lens effect by applying the light in the specified wave range from at least one of the edge of the second optical part facing that of the first optical part and the edge of the first optical part.

23. A method of coupling optical parts according to claim 22, wherein the optical parts includes any one of an optical fiber, waveguide, semiconductor laser, light-emitting diode, photodiode, and semiconductor light amplifier.

24. A method of coupling optical parts according to claim 2, further comprising a step of curing the refractive-index imaging material by applying light to or heating the material.

25. A method of coupling optical parts according to claim 22, wherein the interval between the optical parts to be coupled is set to 0.1 mm or more.

26. The method of coupling optical parts according to claim 22, wherein the refractive-index imaging material comprises:

a binder consisting of one of a copolymer having alicyclic epoxy, chain epoxy, organic denatured silicone, and ethylene unsaturated compound having a hydroxyl group in its end in the building block of the copolymer and a copolymer having any one of ethylene unsaturated compounds containing silicone in the building block of the copolymer;

a photosensitive monomer made of a mixture including multifunctional acrylate or multifunctional methacrylate and an ethylene unsaturated monomer containing an aromatic ring or halogen; and a photopolymerization initiator.

27. The method of coupling optical parts according to claim 22, wherein the refractive-index imaging material comprises an alicyclic or chain compound having an epoxy group, an ethylene unsaturated compound containing an aromatic ring or halogen, multifunctional acrylate or multifunctional methacrylate, and photopolymerization initiator.

28. The method of coupling optical parts according to claim 22, wherein the refractive-index imaging material comprises organic denatured silicone, an ethylene unsaturated compound containing any one of an aromatic ring or halogen, multifunctional acrylate or multifunctional methacrylate, and a photopolymerization initiator.

29. The method of coupling optical parts according to claim 22, wherein the refractive-index imaging material comprises:

a copolymer solution obtained by dissolving an ethylene unsaturated compound whose general expression is shown as "$R_1CH=CHCOOR_2$" in which $R_1$ is any one of $CH_3$ and H and $R_2$ is a chain or alicyclic compound group with carbon atoms of 1 to 4, an ethylene unsaturated compound containing silicone, and thermopolymerization initiator in an solvent and heating and agitating the dissolved substances;

an ethylene unsaturated compound containing an aromatic ring or halogen to be added into the copolymer solution cooled up to the room temperature;

multifunctional acrylate or multifunctional methacrylate to be added to the copolymer solution cooled up to the room temperature; and a photopolymerization initiator to be added to the copolymer solution cooled up to the room temperature.

30. The method of coupling optical parts according to claim 22, wherein the refractive-index imaging material comprises:

a copolymer solution obtained by dissolving an ethylene unsaturated compound whose general expression is shown as "$R_1CH=CHCOOR_2$" in which $R_1$ is any one of $CH_3$ and H and $R_2$ is a chain or alicyclic compound group with carbon atoms of 1 to 4, an ethylene unsaturated compound containing silicone, any one of multifunctional acrylate and multifunctional methacrylate, and thermopolymerization initiator in an solvent and heating and agitating the dissolved substances;

an ethylene unsaturated compound containing an aromatic ring or halogen to be added into the copolymer solution cooled up to the room temperature;

multifunctional acrylate or multifunctional methacrylate to be added to the copolymer solution cooled up to the room temperature; and a photopolymerization initiator to be added to the copolymer solution cooled up to the room temperature.

31. The method of coupling optical parts according to claim 22, wherein the refractive-index imaging material for forming a refractive-index distribution by applying light in a specified wave range comprises a thermosetting copolymer containing acrylate or methacrylate having a hydroxyl group at its end in the building block of the copolymer, an ethylene unsaturated compound containing an aromatic ring or halogen, multifunctional acrylate or multifunctional methacrylate, and a photopolymerization initiator.

* * * * *